(12) United States Patent
Yokogawa

(10) Patent No.: US 8,569,855 B2
(45) Date of Patent: *Oct. 29, 2013

(54) TWO-DIMENSIONAL SOLID-STATE IMAGING DEVICE

(75) Inventor: Sozo Yokogawa, Tokyo (JP)

(73) Assignee: Sony Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/564,229

(22) Filed: Aug. 1, 2012

(65) Prior Publication Data

US 2012/0292521 A1    Nov. 22, 2012

Related U.S. Application Data

(63) Continuation of application No. 12/771,674, filed on Apr. 30, 2010, now Pat. No. 8,269,299.

(30) Foreign Application Priority Data

May 19, 2009   (JP) ................................. 2009-120579

(51) Int. Cl.
*H01L 21/00*   (2006.01)

(52) U.S. Cl.
USPC ........................................................ 257/432

(58) Field of Classification Search
USPC .................. 257/291–294, 431–448, E20.001, 257/E31.003, E31.127
See application file for complete search history.

(56) References Cited

U.S. PATENT DOCUMENTS

| 8,148,762 B2 * | 4/2012 | Joe et al. ........................ 257/294 |
| 2008/0231859 A1 | 9/2008 | Ogino | |

FOREIGN PATENT DOCUMENTS

| JP | 09-148549 | 6/1997 |
| JP | 4124190 | 5/2008 |
| JP | 2008-23049 | 10/2008 |

OTHER PUBLICATIONS

Hidekazu Takahashi; The Institute of Image Information and Television Engineers; vol. 60, No. 3; p. 295-298; 206.
Masuo Fukui et al.; The Basis of Light Nanotechnology; Ohmsha; ISBN 4-274-19713-1.
Laurent Salomon et al.; Near-Field Distribution of Optical Transmission of Periodic Subwavelength Holes in a Metal Film; Physical Review Letters; vol. 86, No. 6; Feb. 5, 2001.

* cited by examiner

*Primary Examiner* — Cuong Q Nguyen
(74) *Attorney, Agent, or Firm* — Sheridan Ross P.C.

(57) ABSTRACT

A camera system with a two-dimensional solid-state imaging device having pixel regions arranged in a two-dimensional matrix, wherein each pixel region has a plurality of subpixel regions, a metal layer with an opening of an opening size smaller than the wavelength of an incoming electromagnetic wave and a photoelectric conversion element are arranged with an insulating film interposed therebetween, at least one photoelectric conversion element is arranged in the opening provided at a portion of the metal layer in each subpixel region, a projection image of the opening is included in a light receiving region of the photoelectric conversion element, the opening is arrayed so as to cause a resonance state based on surface plasmon polariton excited by the incoming electromagnetic wave, and near-field light generated near the opening in the resonance state is converted to an electrical signal by the photoelectric conversion element.

16 Claims, 17 Drawing Sheets

TWO-DIMENSIONAL SOLID-STATE IMAGING DEVICE

RELATED APPLICATION DATA

This application is a continuation of U.S. patent application Ser. No. 12/771,674, filed on Apr. 30, 2010, the entirety of which is incorporated herein by reference to the extent permitted by law. The present invention claims priority to and contains subject matter related to Japanese Patent Application No. JP 2009-120579 filed in the Japan Patent Office on May 19, 2009, the entire contents of which being incorporated herein by reference.

BACKGROUND OF THE INVENTION

1. Field of the Invention

The present invention relates to a two-dimensional solid-state imaging device, and in particular, to a two-dimensional solid-state imaging device which detects near-field light generated by surface plasmon polariton resonance excited by incoming electromagnetic waves.

2. Description of the Related Art

A two-dimensional solid-state imaging device, such as a digital still camera, a video camera, or a camcorder (an abbreviation of a camera-and-recorder having a photographing section called a video camera and a recording section as a single body), is increasingly provided in which a subject is photographed by a photoelectric conversion element including a two-dimensional solid-state imaging element to form an image. With regard to the pixel size of a CCD imaging element or a CMOS imaging element as a mainstream of a solid-state imaging element, with advancement of miniaturization, the physical size of one pixel is about two times larger than the wavelength of visible light. In the photoelectric conversion element, if the incoming area of an incoming electromagnetic wave to the photoelectric conversion element is small, that is, if the opening area of the photoelectric conversion element with respect to the incoming electromagnetic wave is small, the sensitivity of the photoelectric conversion element is lowered as a whole. There are various measures, such as improvement of condensing efficiency by an on-chip lens (for example, see JP-A-9-148549), securement of an opening area by transistor sharing (for example, see Takahashi Hidekazu, The Journal of the Institute of Image Information and Television Engineers, Vol. 60, No. 3, p. 295-298, 2006), or reduction of optical loss in a waveguide according to the use of a rear surface irradiation structure (see Japanese Patent No. 4124190). According to these methods, however, there is no suggestion of an ultimate solution for the problem in that "if the effective opening area of the photoelectric conversion element with respect to the incoming electromagnetic wave is small, the sensitivity of the photoelectric conversion element in each pixel is lowered".

Meanwhile, if light is irradiated onto the metal surface having a specific periodic pattern, a resonance mode [surface plasmon polariton (SPP)] is carried out at the metal surface due to an electromagnetic wave of a frequency component corresponding to the periodic pattern, and an electric field (near-field light) which is $10^2$ to $10^3$ times stronger than normal light is generated due to plasmon resonance (for example, see L. Salomon et al., Physical Review Letters, Vol. 86, No. 6, p. 1110-1113, 2001, and "Fundamentals of Optical Technologies", Masuo Fukui and Motoichi Ohtsu (Ohmsha), ISBN 4-274-19713-1).

Near-field light is non-propagating light caused by the closed lines of electric force generated in a region away from the surface of a substance only by a small distance as compared with the wavelength of an electromagnetic wave when the electromagnetic wave (light) is irradiated onto the substance. In a region away from the substance by a distance equal to or greater than the wavelength of the incoming electromagnetic wave, near-field light is attenuated exponentially and may not be observed. Accordingly, only when a photoelectric conversion element is arranged close to a region where surface plasmon polariton is excited, near-field light can be detected as an electrical signal. Near-field light can be condensed on a spot smaller than the diffraction barrier with sensitivity to the structure smaller than the diffraction barrier uniquely determined by the wavelength of the incoming electromagnetic wave. Then, the electric field intensity is stronger near the generation point of near-field light, and stronger than propagating light by two digits to three digits in a region close to the generation point by about 10 nm. For this reason, even when the opening area of the photoelectric conversion element with respect to the incoming electromagnetic wave is small, the electric field intensity can be increased. Thus, if the photoelectric conversion element is close to the generation point, such that "the effective opening area of the photoelectric conversion element is small", an ultimate solution is obtained against the problem in the related art in that "the sensitivity of the photoelectric conversion element in each pixel is lowered".

For example, a photodetection element using near-field light is described in JP-A-2008-233049. According to the technique described in JP-A-2008-233049, a minute resonator 301 is formed on a substrate 302 made of Si with an insulating film 303 formed of $SiO_2$ to have a thickness of 5 nm interposed therebetween. The minute resonator 301 and the insulating film 303 include nanodots having a planar shape of a scalene triangle. Light incident on the minute resonator 301 causes localized surface plasmon resonance, such that an increase in the electric field occurs at three apexes of the metal nanodots, thereby generating strong near-field light. Photodiode regions 304 are formed near the apexes of the metal nanodots, and independently receive the light intensity near the three apexes. The photodiode regions 304 output the electric field intensity as electric charges, and the electric charges are amplified by an amplification transistor 305 after being accumulated and output by a row selection transistor 306 with positional information.

SUMMARY OF THE INVENTION

According to the technique described in JP-A-2008-233049, color information of three primary colors of red, green, and blue is acquired on the basis of the structure called scalene triangular nanodots, but color information mixed by a plurality of resonance wavelengths is collected at one point. That is, in the light intensity at an apex A of the scalene triangle, the light intensity of red light at the apex A, the light intensity of green light at the apex A, and the light intensity of blue light at the apex A are mixed. Accordingly, reproducibility of color information may be insufficient. In addition, there is no description of a technique for detecting a specific polarization component. Furthermore, there is no description of specified two-dimensional pixel arrangement for realizing a two-dimensional solid-state imaging element.

It is desirable to provide a two-dimensional solid-state imaging device which can detect near-field light due to surface plasmon polariton resonance excited by an incoming electromagnetic wave and can reliably reproduce color information. It is also desirable to provide a two-dimensional solid-state imaging device which has a configuration or a structure capable of further detecting a specific polarization component.

An embodiment of the invention is directed to a two-dimensional solid-state imaging device including pixel regions arranged in a two-dimensional matrix. Each pixel region includes a plurality of subpixel region. A metal layer with an opening of an opening size smaller than the wavelength of an incoming electromagnetic wave and a photoelectric conversion element are arranged with an insulating film interposed therebetween. At least one photoelectric conversion element is arranged in the opening provided at a portion of the metal layer in each subpixel region. A projection image of the opening is included in a light receiving region of the photoelectric conversion element. The opening is arrayed so as to cause a resonance state based on surface plasmon polariton excited by the incoming electromagnetic wave. Near-field light generated near the opening in the resonance state is converted to an electrical signal by the photoelectric conversion element. For convenience, this two-dimensional solid-state imaging device is referred to as "a two-dimensional solid-state imaging device according to a first embodiment of the invention".

Another embodiment of the invention is directed to the two-dimensional solid-state imaging device according to the first embodiment of the invention, wherein a plurality of photoelectric conversion elements are arranged in one opening provided at a portion of the metal layer. A projection image of an edge of the opening is included in the light receiving regions of a plurality of photoelectric conversion elements while a projection image of the opening is not included in the light receiving region of the photoelectric conversion element. Near-field light generated near the opening in the resonance state based on the distribution pattern of wavelengths of the incoming electromagnetic wave and periodic openings is converted to an electrical signal by a plurality of photoelectric conversion elements, thereby acquiring information regarding polarization of the incoming electromagnetic wave. For convenience, this two-dimensional solid-state imaging device is referred to as "a two-dimensional solid-state imaging device according to a second embodiment of the invention".

With the two-dimensional solid-state imaging device according to the embodiments of the invention, the resonance state is generated on the basis of surface plasmon polariton excited by the incoming electromagnetic wave, and near-field light generated near the opening (specifically, near the opening edge) in the resonance state is converted to an electrical signal by the photoelectric conversion element. Therefore, a two-dimensional solid-state imaging device having high sensitivity and a minute opening size can be realized. In addition, each pixel region includes a plurality of subpixel region, and the opening is provided at a portion of the metal layer in each subpixel region. That is, a kind of minute resonator is formed by adjacent openings, and the distance between the openings is optimized, such that near-field light corresponding to different wavelength components can be detected in the respective subpixel regions, and color information can be reliably reproduced. Unlike a color separation system of the related art, such as color filters, color information is detected by the structure of the metal layer itself, so there is little deterioration in characteristics due to the incoming electromagnetic wave, such as ultraviolet rays or high-energy rays, and color information can be stably obtained. Furthermore, a plurality of photoelectric conversion elements are arranged in one opening, such that a specific polarization component can be detected.

In the solid-state imaging element of the related art in which incoming light is photoelectrically converted with a silicon substrate, the incoming electromagnetic wave is photoelectrically converted at a deep location of the substrate depending on the wavelength. That is, in the wavelength band of visible light, blue light (with a wavelength of about 400 nm) is photoelectrically converted at a depth of about 0.2 μm the silicon substrate, and red light (with a wavelength of about 700 nm) is photoelectrically converted at a depth of about 2 μm of the silicon substrate. Therefore, in the solid-state imaging element having sensitivity to the wavelength band of visible light, the substrate should have a thickness of at least several μm. Meanwhile, in the two-dimensional solid-state imaging device according to the embodiment of the invention which detects near-field light, near-field light is excited on the basis of the distance between the openings provided in the metal layer and detected, so there is no relationship between the thickness of the photoelectric conversion element and the detection wavelength. Near-field light reaches only a region with about the wavelength of the incoming electromagnetic wave, so the thickness of the photoelectric conversion element can be sufficiently small, specifically, to about 1 μm.

In the solid-state imaging element of the related art in which the silicon substrate is used as a base, the energy bandgap is 1.1 eV, so an infrared ray with a wavelength greater than 1.1 μm may not be detected. Meanwhile, in the two-dimensional solid-state imaging device according to the embodiments of the invention in which near-field light is generated by surface plasmon polariton resonance and detected, near-field light corresponding to the incoming wavelength based on the distance between the openings provided in the metal layer is generated, so the wavelength of an arbitrary electromagnetic wave can be detected through adjustment of the distance between the openings. That is, an infrared ray with a wavelength greater than 1.1 μm can be detected by a photoelectric conversion element in which a silicon substrate is used as a base.

The opening area of the photoelectric conversion element can be reduced, as compared with the two-dimensional solid-state imaging device of the related art, and thus the number of pixels per unit area can be significantly increased while the area of the entire photoelectric conversion element can be maintained. In addition, the opening area of the photoelectric conversion element is small, so a storage unit or the like for each pixel region can be arranged between the photoelectric conversion element and the photoelectric conversion element. Therefore, a multi-function photoelectric conversion element can be achieved. Furthermore, an increase in the degree of freedom for design of signal wiring or the like can be achieved.

DESCRIPTION OF THE PREFERRED EMBODIMENTS

Figure 1A:
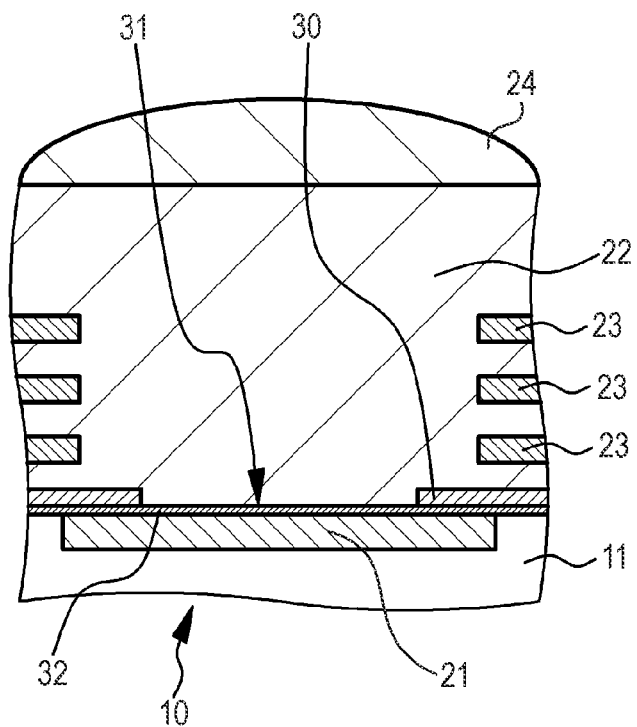
FIGS. 1A and 1B are schematic partial sectional views of a two-dimensional solid-state imaging device of Example 1.

Hereinafter, examples of the invention will be described with reference to the drawings, but the invention is not limited to Examples. In Examples, various numerical values or materials are for illustration. The description will be provided in the following sequence.

1. General Description of Two-Dimensional Solid-State Imaging Device according to First Embodiment and Second Embodiment of the Invention 2. Example 1 (two-dimensional solid-state imaging device according to first embodiment of the invention, first configuration)

3. Example 2 (modification of Example 1)

4. Example 3 (another modification of Example 1)

5. Example 4 (yet another modification of Example 1)

6. Example 5 (modification of Example 1, second configuration)

7. Example 6 (modification of Example 5)

8. Example 7 (two-dimensional solid-state imaging device according to second embodiment of the invention, others)

[General Description of Two-Dimensional Solid-State Imaging Device According to First Embodiment and Second Embodiment of the Invention]

In the two-dimensional solid-state imaging device according to the second embodiment of the invention, a plural number ($P_0$) of photoelectric conversion elements are arranged in one opening, such that information regarding polarization of $P_0$ incoming electromagnetic waves can be acquired. Meanwhile, $2P_0$ photoelectric conversion elements are arranged in one opening in a circular pattern, and the p-th photoelectric conversion element (where p is 1, 2, ..., and $P_0$) and the $(p+P_0)$th photoelectric conversion element are paired to acquire information regarding polarization of the incoming electromagnetic waves, such that information regarding polarization of the $P_0$ incoming electromagnetic waves can be more reliably acquired. The value of $P_0$ may be one of 2, 3, and 4.

In the two-dimensional solid-state imaging device according to the first or second embodiment of the invention including the above-described preferred embodiment, the thickness of the insulating film may be equal to or smaller than $1 \times 10^{-7}$ m (100 nm). It is preferable that the thickness of the insulating film is as small as possible. When a silicon oxide film is used, in terms of dielectric strength between the metal layer and the photoelectric conversion element, the thickness of the insulating film may be equal to or greater than $5 \times 10^{-9}$ m (5 nm). From a viewpoint of reduction of leakage current between insulating films, a so-called High-k material, such as hafnium oxide ($HfO_2$), zirconium oxide ($ZrO_2$), aluminum oxide ($Al_2O_3$), yttrium oxide ($Y_2O_3$), lanthanum oxide ($La_2O$), or HfSiON, is appropriately used.

In the two-dimensional solid-state imaging device according to the first or second embodiment of the invention including the above-described preferred embodiment, each pixel region may include a first subpixel region and M subpixel regions adjacent to the first subpixel region, each subpixel region may have one opening, and when the distance from the center of the opening of the first subpixel region to the center of the opening of the m-th subpixel region [where m is 2, 3, ..., and (M+1)] is $L_m$, near-field light corresponding to a wavelength component depending on a wavelength component of the incoming electromagnetic wave and the distance $L_m$ may be converted to an electrical signal by the photoelectric conversion element. For convenience, this is referred to as "a two-dimensional solid-state imaging device of a first configuration".

In the two-dimensional solid-state imaging device of the first configuration, near-field light corresponding to wavelength components depending on q (where q is a natural number equal to or greater than 2 and equal to or smaller than M) wavelength components of the incoming electromagnetic wave and q' (where q' is a natural number equal to or greater than 2 and equal to or smaller than M) distances $L_m$ may be converted to an electrical signal by the photoelectric conversion element in at least the m-th subpixel region. Alternatively, in the two-dimensional solid-state imaging device of the first configuration including such a configuration, the value of M may be 3, and the center of the opening of each of four subpixel regions in one pixel region may be located at the apex of a virtual square, a virtual rectangle, or a virtual parallelogram.

Specifically, when the center of the opening of each of the four subpixel regions in one pixel region is located at the apex of the virtual square, near-field light corresponding to q wavelength components due to surface plasmon polariton resonance excited depending on q (where q=2 or 3) wavelength components of the incoming electromagnetic wave and two distances $L_m$ (specifically, for example, m=2 and 4, and m=3) may be converted to an electrical signal by the photoelectric conversion elements in the first subpixel region and the m-th subpixel region. In this case, the value of $P_0$ may be 3, and thus four kinds of information regarding polarization of the incoming electromagnetic wave can be acquired to the maximum. Specifically, when a virtual square ABCD is provided, in each pixel region, a pair of photoelectric conversion elements may be arranged parallel to the side AB, and a pair of photoelectric conversion elements may be arranged parallel to the side AD orthogonal to the side AB. As occasion demands, a pair of photoelectric conversion elements may be arranged parallel to the line segment AC, and a pair of photoelectric conversion elements may be arranged parallel to the line segment BD. When the value of $P_0$ is 1, an arbitrary polarization component can be acquired with no distinction. In this case, one photoelectric conversion element may be arranged in the opening forming the virtual square ABCD.

Alternatively, when the center of the opening of each of the four subpixel regions in one pixel region is located at the apex of a virtual rectangle, near-field light corresponding to three wavelength components due to surface plasmon polariton resonance excited depending on three wavelength components of the incoming electromagnetic wave and three distances $L_m$ (m=2, m=3, and m=4) may be converted to an electrical signal by the photoelectric conversion elements in the first subpixel region and the m-th subpixel region. In this case, the value of $P_0$ may be 3, and thus four kinds of information regarding polarization of the incoming electromagnetic wave can be acquired to the maximum. Specifically, when a virtual rectangle ABCD is provided, in each pixel region, a pair of photoelectric conversion elements may be arranged parallel to the side AB, a pair of photoelectric conversion elements may be arranged parallel to the side AD intersecting the side AB, and a remaining pair of photoelectric conversion elements may be arranged parallel to the line segment AC. As occasion demands, a pair of photoelectric conversion elements may be arranged parallel to the line segment BD. When the value of $P_0$ is 1, an arbitrary polarization component can be acquired with no distinction. In this case, one photoelectric conversion element may be arranged in the opening forming the virtual rectangle ABCD.

Alternatively, when the center of the opening of each of the four subpixel regions in one pixel region is located at the apex of the virtual parallelogram, near-field light corresponding to q wavelength components due to surface plasmon polariton resonance excited depending on q (where q=3 or 4) wavelength components of the incoming electromagnetic wave and q distances $L_m$ may be converted electrical signal to the photoelectric conversion elements in the first subpixel region and the m-th subpixel region. In this case, the value of $P_0$ may be q, and thus q kinds of information regarding polarization of the incoming electromagnetic wave can be acquired. Specifically, when a virtual parallelogram ABCD is provided, in each pixel region, a pair of photoelectric conversion elements may be arranged parallel to the side AB, a pair of photoelectric conversion elements may be arranged parallel to the side AD intersecting the side AB, and a remaining pair of photoelectric conversion elements may be arranged parallel to the line segment AC (when q=3). As occasion demands, a pair of photoelectric conversion elements may be further arranged parallel to the line segment BD (when q=4). When the value of $P_0$ is 1, an arbitrary polarization component can be acquired with no distinction. In this case, one photoelectric conversion element may be arranged in the opening forming the virtual parallelogram ABCD.

Alternatively, in the two-dimensional solid-state imaging device according to the first or second embodiment of the invention including the above-described preferred embodiment, each pixel region may include a first subpixel region and N subpixel regions surrounding the first subpixel region, each subpixel region may have one opening, and when the distance from the center of the opening of the first subpixel region to the center of the opening of the n-th subpixel region [where n is 2, 3, . . . , and (N+1)] is $L_n$, near-field light corresponding to a wavelength component depending on a wavelength component of the incoming electromagnetic wave and the distance $L_n$ may be converted to an electrical signal by the photoelectric conversion element. For convenience, this is referred to as "a two-dimensional solid-state imaging device of a second configuration".

In the two-dimensional solid-state imaging device of the second configuration, near-field light corresponding to wavelength components depending on q (where q is a natural number equal to or greater 1 and equal to or smaller than N) wavelength components of the incoming electromagnetic wave and q' (where q' is a natural number equal to or greater 1 and equal to or smaller than N) distances $L_n$ may be converted to an electrical signal by the photoelectric conversion element in at least the n-th subpixel region. Alternatively, in the two-dimensional solid-state imaging device of the second configuration including such a configuration, the value of N may be 6, the center of the opening of each of the N subpixel regions surrounding the first subpixel region in one pixel region may be located at the apex of a virtual regular hexagon, and the center of the opening of the first subpixel region may be located at the center of the virtual regular hexagon. Alternatively, in the two-dimensional solid-state imaging device of the second configuration including such a configuration, the value of N may be 8, and the center of the opening of each of four adjacent subpixel regions in one pixel region may be located at the apex of a virtual square, a virtual rectangle, or a virtual parallelogram, or at the apex of a virtual regular octagon.

Specifically, when the value of N is 6, the center of the opening of each of the N subpixel regions surrounding the first subpixel region in one pixel region is located at the apex of the virtual regular hexagon, and the center of the opening of the first subpixel region is located at the center of the virtual regular hexagon, near-field light corresponding to one or more, or N or less wavelength components due to surface plasmon polariton resonance excited depending on one or more, or N or less wavelength components of the incoming electromagnetic wave and one distance $L_m$ may be converted to an electrical signal by the photoelectric conversion elements in the first subpixel region and the n-th subpixel region. In this case, the value of $P_0$ may be 3, and thus three kinds of information regarding polarization of the incoming electromagnetic wave can be acquired. Specifically, when a virtual regular hexagon ABCDEF is provided, in each pixel region, a pair of photoelectric conversion elements may be arranged parallel to the side AD, a pair of photoelectric conversion elements may be arranged parallel to the side BE, and a remaining pair of photoelectric conversion elements may be arranged parallel to the side CF. When the value of $P_0$ is 1, an arbitrary polarization component polarization component can be acquired with no distinction. In this case, one photoelectric conversion element may be arranged in the opening forming the virtual regular hexagon ABCDEF.

Alternatively, when the value of N is 8, and the center of the opening of each of four adjacent subpixel regions in one pixel region is located at the apex of a virtual square, near-field light corresponding to two or more, or N or less wavelength components due to surface plasmon polariton resonance excited depending on two or more, or N or less wavelength components of the incoming electromagnetic wave and two distances $L_m$ (specifically, n=2, 4, 6, and 8, and n=3, 5, 7, and 9) may be converted to an electrical signal by the photoelectric conversion elements in the first subpixel region and the n-th subpixel region. In this case, the value of $P_0$ may be 4, and thus four kinds of information regarding polarization of the incoming electromagnetic wave can be acquired. Specifically, when a virtual square ABCD, a virtual square ADEF, a virtual square AFGH, and a virtual square AHIB are provided, in each pixel region, a pair of photoelectric conversion elements may be arranged parallel to the sides AB and AE, a pair of photoelectric conversion elements may be arranged parallel to the sides AD and AE orthogonal to the sides AB and AE, a pair of photoelectric conversion elements may be arranged parallel to the line segments AC and AG, and a remaining pair of photoelectric conversion elements may be arranged parallel to the line segments AE and AI.

Alternatively, when the value of N is 8, and the center of the opening of each of four adjacent subpixel regions in one pixel region is located at the apex of a virtual rectangle, near-field light corresponding to three or more, or N or less wavelength components due to surface plasmon polariton resonance excited depending on three or more, or N or less wavelength components of the incoming electromagnetic wave and three distances $L_m$ may be converted to an electrical signal by the photoelectric conversion elements in the first subpixel region and the n-th subpixel region. In this case, the value of $P_0$ may be 4, and thus four kinds of information regarding polarization of the incoming electromagnetic wave can be acquired. Specifically, when a virtual rectangle ABCD, a virtual rectangle ADEF, a virtual rectangle AFGH, and a virtual rectangle AHIB are provided, in each pixel region, a pair of photoelectric conversion elements may be arranged parallel to the sides AB and AE, a pair of photoelectric conversion elements may be arranged parallel to the sides AD and AE orthogonal to the sides AB and AE, a pair of photoelectric conversion elements may be arranged parallel to the line segments AC and AG, and a remaining pair of photoelectric conversion elements may be arranged parallel to the line segments AE and AI.

Alternatively, when the value of N is 8, and the center of the opening of each of four adjacent subpixel regions in one pixel region is located at the apex of a virtual parallelogram, near-field light corresponding to three or more, or N or less wavelength components due to surface plasmon polariton resonance excited depending on three or more, or N or less wavelength components of the incoming electromagnetic wave and q' (where q'=3 or 4) distances $L_m$ may be converted to an electrical signal by the photoelectric conversion elements in the first subpixel region and the n-th subpixel region. In this case, the value of $P_0$ may be q', and thus q' kinds of information regarding polarization of the incoming electromagnetic wave can be acquired. Specifically, when a virtual parallelogram ABCD, a virtual parallelogram ADEF, a virtual parallelogram AFGH, and a virtual parallelogram AHIB are provided, in each pixel region, a pair of photoelectric conversion elements may be arranged parallel to the sides AB and AE, a pair of photoelectric conversion elements may be arranged parallel to the sides AD and AE intersecting the sides AB and AE, and a pair of photoelectric conversion elements may be arranged parallel to the line segments AC and AG (when q=3). If necessary, a remaining pair of photoelectric conversion elements may be arranged parallel to the line segments AE and AI (when q=4).

In the two-dimensional solid-state imaging devices of the invention including various preferred embodiments, configuration, the two-dimensional solid-state imaging device of the first configuration, and the two-dimensional solid-state imaging device of the second configuration, a refractive index variable layer may be provided on the light incoming side of the opening. As the material for the refractive index variable layer, an insulating material which is transparent to incoming light, specifically, silicon oxide ($SiO_2$) or a composite material mainly containing $SiO_2$ is appropriately used. In addition, oxide or nitride, such as magnesium fluoride ($MgF_2$), silicon nitride (SiN), titanium oxide ($TiO_2$), tantalum oxide ($Ta_2O_5$), zirconium oxide ($ZrO_2$), niobium oxide ($Nb_2O_5$), or hafnium oxide ($HfO_2$), may be used. Alternatively, the refractive index variable layer may have an uneven periodic structure smaller than the wavelength of the incoming electromagnetic wave. In this case, silicon oxide ($SiO_2$), magnesium fluoride ($MgF_2$), or air may be used as a low-refractive-index medium, and silicon nitride (SiN), titanium oxide ($TiO_2$), tantalum oxide ($Ta_2O_5$), zirconium oxide ($ZrO_2$), niobium oxide ($Nb_2O_5$), or hafnium oxide ($HfO_2$) may be used as a high-refractive-index medium. The mediums are arranged one- or two-dimensionally and periodically in a physical scale significantly smaller than the incoming electromagnetic wave, such that an effective refractive index becomes a value obtained by averaging the refractive indexes of both mediums. That is, an arbitrary refractive index can be obtained which is an intermediate refractive index between the low-refractive-index medium and the high-refractive-index medium.

In the two-dimensional solid-state imaging devices including various preferred embodiments (hereinafter, collectively referred to as "a two-dimensional solid-state imaging device and the like of the invention"), configuration, the two-dimensional solid-state imaging device of the first configuration, and the two-dimensional solid-state imaging device of the second configuration, the photoelectric conversion element may be a CCD, CMOS, or CMD (Charge Modulation Device) signal amplification-type image sensor, or a PIN diode. In addition, a sensor for heat detection, such as a bolometer, may be used. In the CCD signal amplification-type image sensor of the related art, photoelectric conversion with the long wavelength (red: about 700 nm) occurs at a deep portion or at a depth of about 2 μm of the silicon substrate. For this reason, in the image sensor of the related art in which photoelectric conversion is performed in the depth direction with the light absorption coefficient of silicon as a base, it is technically impossible to make the thickness of the silicon substrate be equal to or smaller than several μm. In the two-dimensional solid-state imaging device of the invention, near-field light generated at the opening edge (edge portion) is detected and photoelectrically converted, so even when the silicon substrate is thin, there is no problem. Specifically, the photoelectric conversion element is formed in the silicon substrate, such that photoelectric conversion can be performed at a depth equal to or smaller than 1 μm from the surface of the silicon substrate. In addition, a TFT using low-temperature polysilicon may be used. As the two-dimensional solid-state imaging device and the like of the invention, a front surface irradiation-type two-dimensional solid-state imaging device or a rear surface irradiation-type two-dimensional solid-state imaging device may be exemplified. A digital still camera, a video camera, or a camcorder can be configured from the two-dimensional solid-state imaging device or the like of the invention. Furthermore, an optical communication system, an information communication system, or an optical information transmission/reception system for inter-vehicle communication or road-vehicle communication may be configured.

As occasion demands, in order to efficiently detect near-field light, the central portion of the light receiving region of the photoelectric conversion element may be convex, and the distance between the top surface of the light receiving region of the photoelectric conversion element and the metal layer or the distance between the top surface of the light receiving region of the photoelectric conversion element and the opening edge (edge portion) may be reduced. In addition, in order to efficiently detect near-field light generated at the opening edge (edge portion), the center of the light receiving region of the photoelectric conversion element may be arranged below or directly below the opening edge (edge portion).

In the two-dimensional solid-state imaging device and the like of the invention, a plurality of pixel regions are arranged in a two-dimensional matrix of the X direction and the Y direction as a whole.

In the two-dimensional solid-state imaging device and the like of the invention, the incoming electromagnetic wave may be visible light with a wavelength in a range of 0.4 μm to 0.7 μm, an ultraviolet ray with a wavelength equal to or smaller than 0.4 μm, or an infrared ray with a wavelength equal or greater than 0.7 μm.

An opening size d of the opening is preferably smaller than the wavelength of the incoming electromagnetic wave as a detection target. With regard to detection of the wavelength band of visible light, the opening size d of the opening is preferably in a range of 0.1 μm to 0.3 μm. Alternatively, the opening size d of the opening is preferably equal to or smaller than half of the spot spread at a diffraction barrier with the wavelength of an electromagnetic wave detected by the photoelectric conversion element. The inter-center distance D between the openings of adjacent subpixel regions may be the same as the wavelength of an electromagnetic wave as a detection target. With regard to detection of the wavelength band of visible light, the distance D is preferably in a range of about 0.4 μm to 0.8 μm. The opening may be filled with a medium (for example, a refractive index variable layer made of a dielectric material), such as a silicon oxide film or a silicon nitride film, which is transparent to the incoming electromagnetic wave. In this case, it should suffice that, when the refractive index of the medium is $n_0$, the inter-center distance D between the openings may be, for example, $(1/n_0)$ times of the distance D when the opening is not filled with the medium. For example, in terms of a visible light wavelength, the wavelengths $\lambda_R$, $\lambda_G$, and $\lambda_B$ of red, green, and blue are roughly as follows.

$\lambda_R$: 600 nm to 800 nm
$\lambda_G$: 500 nm to 600 nm
$\lambda_B$: 380 nm to 500 nm Thus, the inter-center distance between the openings when the refractive index of the medium is 1.5 (the inter-center distance $D_R$ between the openings in the subpixel regions detecting red light, the inter-center distance $D_G$ between the openings in the subpixel regions detecting green light, and the inter-center distance $D_B$ between the openings in the subpixel regions detecting blue light) may be as follows, for example.

$D_R$: 400 nm to 530 nm
$D_G$: 330 nm to 400 nm
$D_B$: 250 nm to 330 nm

Thus, "the inter-center distance D between the openings" also includes a so-called effective distance in terms of the refractive index of the medium. In this case, the specific dielectric constant of the medium is preferably equal to or close to the specific dielectric constant of the material constituting the photoelectric conversion element.

The projection image of the opening is a projection when viewed from the normal direction of the image photoelectric conversion element. The planar shape of the opening may be an arbitrary planar shape, such as a circle, a triangle, a rectangle, a hexagon, an octagon, a rhombus, an ellipse, a star, or a cross. The planar shape of the opening is not particularly limited insofar as the opening has a periodic structure capable of exciting surface plasmon polariton (SPP) in a band of visible light wavelength to near-infrared wavelength. The sectional shape of the opening taken along a virtual plane parallel to the thickness direction of the metal layer may be a rectangle (the planar shape of the opening at the upper surface of the metal layer is the same as the planar shape of the opening at the lower surface of the metal layer), a step-like sectional shape in which the sectional area decreases from the upper surface of the metal layer toward the lower surface in a stepwise manner (the number of steps may be equal to or greater than 1), or a slope-like sectional shape in which the sectional area decreases from the upper surface of the metal layer toward the lower surface monotonically. It is assumed that an electromagnetic wave is incoming from the upper surface of the metal layer. The step- or slope-like sectional shape can ensure that the opening size differs at different depths of the metal layer, so the resonance wavelength in the resonance state generated based on surface plasmon polariton can be widened.

Examples of the material for the metal layer include noble metals with small plasmon loss, such as silver (Ag), gold (Au), and platinum (Pt), and conductive materials, such as aluminum (Al), copper (Cu), and titanium oxide. Alternatively, the metal layer may be formed by coating the surface of a silicon-based material with the conductive material, or may be formed by coating a linear material, such as a nanorod or a nanowire, spherical particles, such as nanoparticles, or dielectric microspheres with the conductive material. The thickness of the metal layer may be in a range of $1 \times 10^{-8}$ m (10 nm) to $1 \times 10^{-6}$ m (1 μm), specifically, about 50 nm.

The insulating film is preferably made of a material having an excellent insulation property and being suitable for reduction in thickness, such as a silicon oxide film, a silicon nitride film, a silicon oxynitride film, hafnium oxide, zirconium oxide, aluminum oxide, yttrium oxide, lanthanum oxide, or HfSiON. It is preferable that the thickness of the insulating film is as small as possible. Specifically, as described above, the thickness of the insulating film is preferably equal to or smaller than $1 \times 10^{-7}$ m.

As the method of manufacturing an opening in the metal layer, a combination of a technology for forming the metal layer and a technology for patterning the metal layer by lithography and etching (for example, anisotropic dry etching using carbon tetrafluoride gas, sulfur hexafluoride gas, trifluoromethane gas, or xenon difluoride gas, or physical etching), or a so-called lift-off technique may be used. As the method of forming the metal layer, various vacuum deposition methods or physical vapor deposition (PVD), such as sputtering, chemical vapor deposition (CVD), plating, MOCVD, or MBE may be used. As the lithography, photolithography (lithography using g-line, i-line, KrF excimer laser, or ArF excimer laser of a high-pressure mercury lamp as a light source), electron beam lithography, or X-ray lithography may be used. Alternatively, a metal layer having an opening may be formed by microfabrication with an extremely short pulse laser, such as a femtosecond layer, or nanoimprint.

Example 1

Example 1 relates to the two-dimensional solid-state imaging device according to the first embodiment of the invention, and to a two-dimensional solid-state imaging device of a first structure. In Example 1 or Examples 2 to 7 described below, the two-dimensional solid-state imaging device has a plurality of pixel regions arranged in a two-dimensional matrix of the X direction and the Y direction as a whole.

Figure 1B:
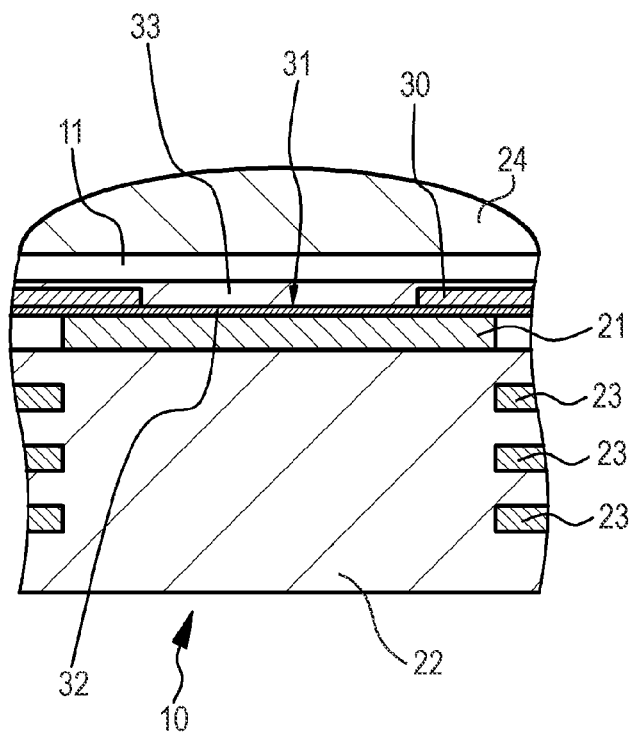
Figure 2:
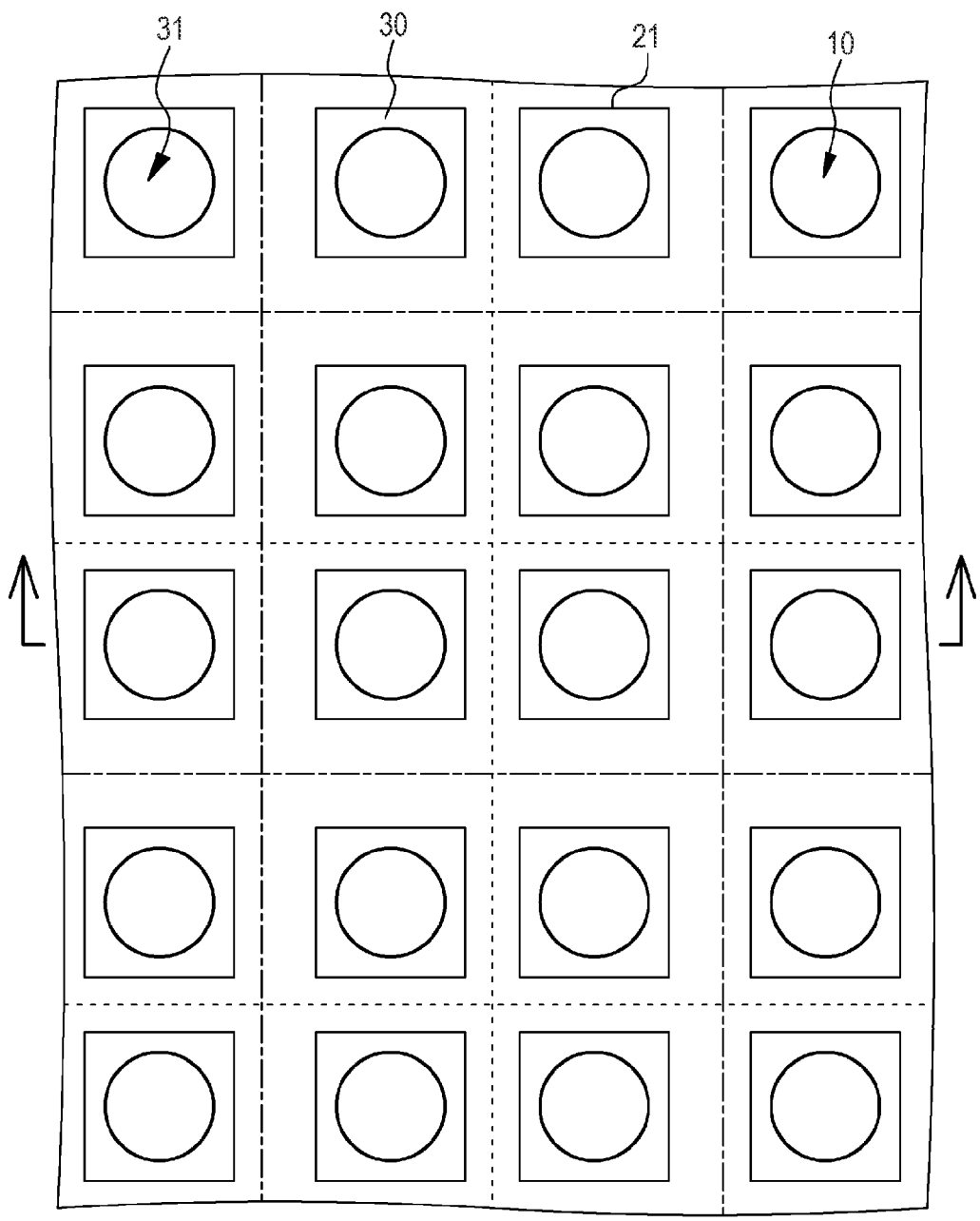
FIG. 2 is a diagram schematically showing arrangement of pixel regions and subpixel regions in the two-dimensional solid-state imaging device of Example 1.
Figure 3A:
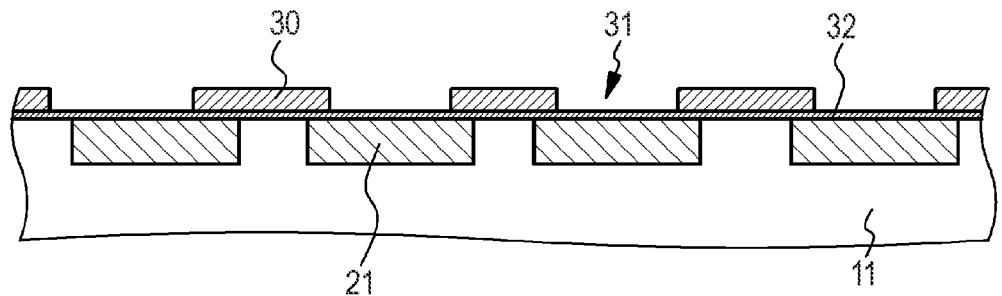
FIG. 3A is a schematic partial end view of the pixel regions and the subpixel regions of the two-dimensional solid-state imaging device of Example 1 taken along the arrow of FIG. 2.
Figure 3B:
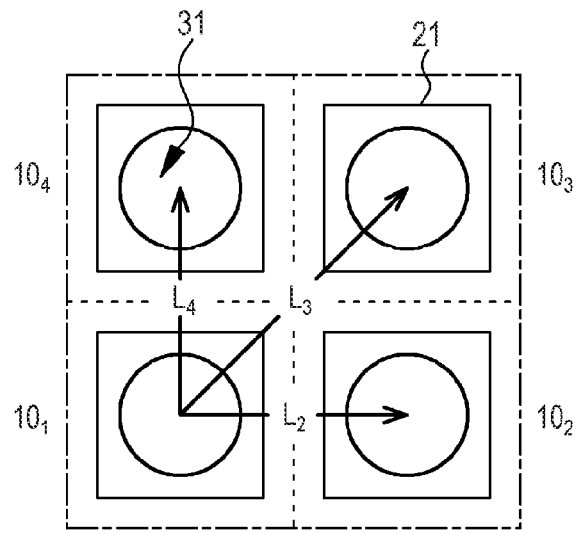
FIG. 3B is a conceptual view regarding arrangement of the pixel regions and the subpixel regions in the two-dimensional solid-state imaging device of Example 1.
Figure 3C:
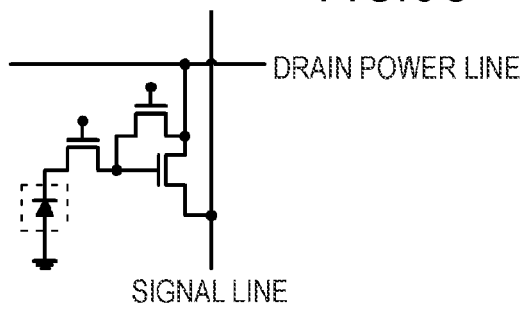
FIG. 3C is an equivalent circuit diagram of one subpixel region in the two-dimensional solid-state imaging device of Example 1.

FIGS. 1A and 1B are schematic partial sectional views of the two-dimensional solid-state imaging device of Example 1 or Examples 2 to 7 described below. FIG. 2 schematically shows arrangement of pixel regions and subpixel regions in the two-dimensional solid-state imaging device of Example 1. FIG. 3A is a schematic partial end view of the pixel regions and the subpixel regions taken along the arrow of FIG. 2. FIG. 3B is a conceptual view regarding arrangement of the pixel regions and the subpixel regions. FIG. 3C is an equivalent circuit diagram of one subpixel region. In FIG. 3C, a photoelectric conversion element (light receiving element) is surrounded by a dotted line. In other drawings, a photoelectric conversion element (light receiving element) is represented by a solid-line rectangle.

In the two-dimensional solid-state imaging device of Example 1, pixel regions are arranged in a two-dimensional matrix, and each pixel region includes a plurality of subpixel regions 10. In the drawings, the pixel region is surrounded by a one-dot-chain line, and the subpixel region 10 is surrounded by a dotted line. A metal layer 30 with an opening 31 of an opening size smaller than the wavelength of the incoming electromagnetic wave and a photoelectric conversion element (light receiving element) 21 are arranged with an insulating film 32 interposed therebetween, and at least one photoelectric conversion element 21 is arranged in the opening 31 provided at a portion of the metal layer 30 in each subpixel region 10. In Example 1 or Examples 2 to 6 described below, one photoelectric conversion element 21 is arranged in the opening 31. A projection image of the opening 31 is included in the light receiving region of the photoelectric conversion element 21, and the opening 31 is arranged such that a resonance state based on surface plasmon polariton excited by the incoming electromagnetic wave is generated. This resonance state causes near-field light generated near the opening 31 to be converted to an electrical signal by the photoelectric conversion element 21. That is, the opening 31 is arranged such that surface plasmon polariton resonance based on the incoming electromagnetic wave is generated, and surface plasmon polariton resonance causes near-field light generated near the opening 31 to be converted to an electrical signal by the photoelectric conversion element 21. Specifically, while near-field light is generated near the opening edge, the projection image of the opening 31 is included in the light receiving region of the photoelectric conversion element 21, that is, the light receiving region of the photoelectric conversion element 21 necessarily exists below the opening edge, so near-field light can be reliably detected by the photoelectric conversion element 21.

In the two-dimensional solid-state imaging device of Example 1, each pixel region includes a first subpixel region and M subpixel regions adjacent to the first subpixel region, and each subpixel region 10 has one opening 31. When the distance from the center of the opening 31 of the first subpixel region $10_1$ to the center of the opening 31 of the m-th subpixel region $10_m$ [where m is 2, 3, ..., and (M+1)] is $L_m$, near-field light corresponding to a wavelength component depending on a wavelength component of the incoming electromagnetic wave and the periodic structure of the distance $L_m$ is converted to an electrical signal by the photoelectric conversion element 21. That is, the opening 31 and the opening 31 arranged adjacent to each other form a kind of minute resonator.

Specifically, in Example 1, near-field light corresponding to wavelength components depending on q (where q is a natural number equal to or greater than 2 and equal to or smaller than M) wavelength components of the incoming electromagnetic wave and q' (where q' is a natural number equal to or greater than 2 and equal to or smaller than M) distances $L_m$ is converted to an electrical signal by the photoelectric conversion element 21 in at least the m-th subpixel region $10_m$. In Example 1, the value of M is 3, and the center of the opening 31 of each of four subpixel regions in one pixel region is located at the apex of a virtual square.

Specifically, as shown in the conceptual view of FIG. 3B, the center of the opening 31 of each of the four subpixel regions in one pixel region is located at the apex of the virtual square, and near-field light corresponding to two wavelength components due to surface plasmon polariton resonance excited depending on two wavelength components of the incoming electromagnetic wave and the periodic structure of two distances $L_m$ (specifically, m=2 and 4, and m=3) is converted to an electrical signal by the photoelectric conversion elements 21 in the first subpixel region $10_1$ and the m-th subpixel region $10_m$.

That is, the distance $L_2$ between the center of the opening 31 of the first subpixel region $10_1$ and the center of the opening 31 of the second subpixel region $10_2$, and the distance $L_4$ between the center of the opening 31 of the first subpixel region $10_1$ and the center of the opening 31 of the fourth subpixel region $10_4$ define the first inter-center distance $D_1$ between the openings in adjacent subpixel regions, and further define a first wavelength component of the incoming electromagnetic wave. Then, near-field light corresponding to the first wavelength component due to surface plasmon polariton resonance excited depending on the first distance $D_1$ and the first wavelength component of the incoming electromagnetic wave is converted to an electrical signal by the photoelectric conversion elements 21 in the first subpixel region $10_1$, the second subpixel region $10_2$, and the fourth subpixel region $10_4$. In addition, the distance $L_3$ between the center of the opening 31 of the first subpixel region $10_1$ and the center of the opening 31 of the third subpixel region $10_3$ defines the second inter-center distance $D_2$ ($\neq D_1$) between the openings in adjacent subpixel regions, and further defines a second wavelength component of the incoming electromagnetic wave. Then, near-field light corresponding to the second wavelength component due to surface plasmon polariton resonance excited depending on the second distance $D_2$ and the second wavelength component of the incoming electromagnetic wave is converted to an electrical signal by the photoelectric conversion elements 21 in the first subpixel region $10_1$ and the third subpixel region $10_3$.

Near-field light corresponding to the first wavelength component and near-field light corresponding to the second wavelength component are converted to the electrical signals by the photoelectric conversion elements 21 in the respective subpixel regions. Separation between the electrical signal based on near-field light corresponding to the first wavelength component and the electrical signal based on near-field light corresponding to the second wavelength component will be described in Example 7.

The same is applied to when the second subpixel region is regarded as the first subpixel region $10_1$, when the third subpixel region is regarded as the first subpixel region $10_1$, and when the fourth subpixel region is regarded as the first subpixel region $10_1$. The same is applied later.

In Example 1 or Examples 2 to 7 described below, the thickness of the insulating film 32 is equal to or smaller than $1 \times 10^{-7}$ m, specifically, 10 nm. The insulating film 32 is made of $SiO_2$. The metal layer 30 is formed of a gold (Au) layer having a thickness of 50 nm. The planar shape of the opening 31 is a circle. The shapes of the insulating film 32, the metal layer 30, and the opening 31 are not limited thereto. In Example 1 or Examples 2 to 7 described below, the incoming electromagnetic wave may be visible light with a wavelength in a range of 0.4 µm to 0.7 µm, an ultraviolet ray with a wavelength equal to or smaller than 0.4 µm, or an infrared ray with a wavelength equal to or greater than 0.7 µm.

In Example 1 or Examples 2 to 7 described below, the photoelectric conversion element 21 is a CMOS signal amplification-type image sensor, but the invention is not limited thereto. A CCD or CMD signal amplification-type image sensor may be used, or a PIN diode may be used. In the two-dimensional solid-state imaging device of Example 1 or Examples 2 to 7 described below, an electromagnetic wave which is detected (received) by the photoelectric conversion element 21 is, for example, visible light. When a CMOS signal amplification-type image sensor is used, for element separation, a known structure, such as a LOCOS structure, an EDI (Expanding Photodiode Design for Isolation) structure, or a STI (Shallow Trench Isolation) structure, may be used.

The two-dimensional solid-state imaging device shown in FIG. 1A is a front surface irradiation-type two-dimensional solid-state imaging device, and the two-dimensional solid-state imaging device shown in FIG. 1B is a rear surface irradiation-type two-dimensional solid-state imaging device. In the front surface irradiation-type two-dimensional solid-state imaging device of FIG. 1A, light condensed by a condensing element 24 having an on-chip micro convex lens passes through a planarizing layer 22 made of a transparent material, such as $SiO_2$ or SiN. Then, light collides against the metal layer 30, such that near-field light is generated near the opening 31 provided in the metal layer 30 and guided to the photoelectric conversion element 21. The metal layer 30 also functions as a so-called light shielding layer. Then, near-field light is accumulated as electric charges by photoelectric conversion and read to the outside as an electrical signal. Reference numeral 11 denotes a substrate, such as a silicon substrate, and reference numeral 23 denotes a wire layer made of aluminum (Al). The photoelectric conversion element 21 is formed in the substrate 11. The opening 31 provided in the metal layer 30 is actually filled with the planarizing layer 22. Meanwhile, in the rear surface irradiation-type two-dimensional solid-state imaging device of FIG. 1B, light condensed by the condensing element 24 passes through the substrate 11. Then, light collides against the metal layer 30, such that near-field light is generated near the opening 31 provided in the metal layer 30 and guided to the photoelectric conversion element 21. Then, near-field light is accumulated as electric charges by photoelectric conversion and read to the outside as an electrical signal. The opening 31 is filled with a medium 33 which is transparent to the incoming electromagnetic wave. The condensing element may be a sub-wavelength lens (SWLL) having the periodic structure of a physical size smaller than the wavelength of an electromagnetic wave (visible light) incoming to the photoelectric conversion element 21, in addition to an on-chip micro convex lens.

Figure 4A:
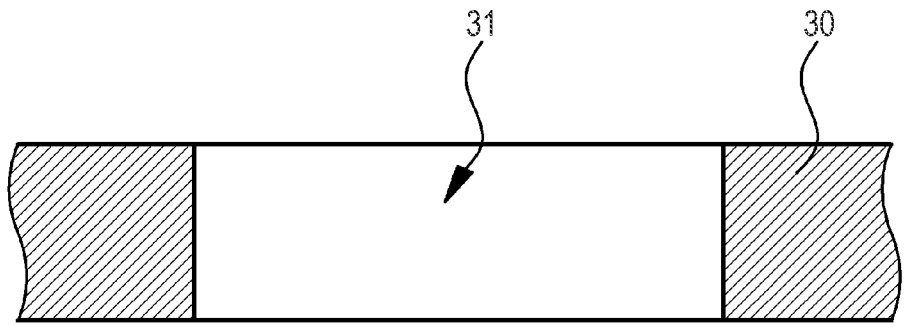
FIGS. 4A to 4D are schematic partial sectional views showing the sectional shape of the opening taken along a virtual plane parallel to the thickness direction of a metal layer.
Figure 4B:
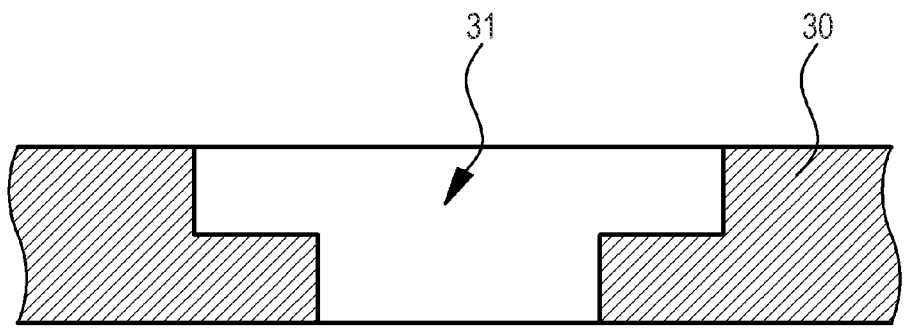
Figure 4C:
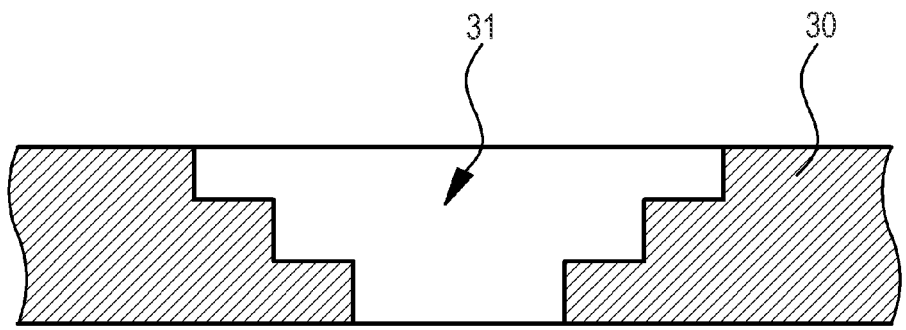
Figure 4D:
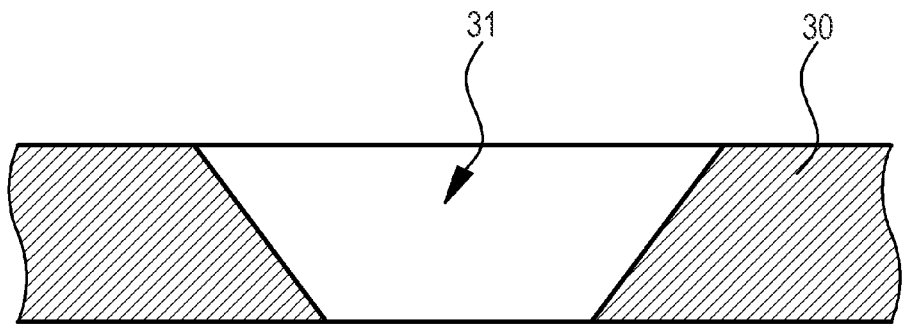

FIG. 3A shows the sectional shape of the opening 31 taken along a virtual plane parallel to the thickness direction of the metal layer 30. Alternatively, as shown in FIG. 4A, the sectional shape of the opening 31 is a rectangle (the planar shape of the opening 31 at the upper surface of the metal layer 30 is identical to the planar shape of the opening 31 at the lower surface of the metal layer 30). In addition, as schematically shown in FIGS. 4B and 4C, the opening 31 may have a step-like sectional shape in which the sectional area decreases from the upper surface of the metal layer 30 toward the lower surface in a stepwise manner (the number of steps may be equal to or greater than 1), or as schematically shown in FIG. 4D, the opening 31 may have a slope-like sectional shape in which the sectional area decreases from the upper surface of the metal layer 30 toward the lower surface monotonically.

Figure 3D:
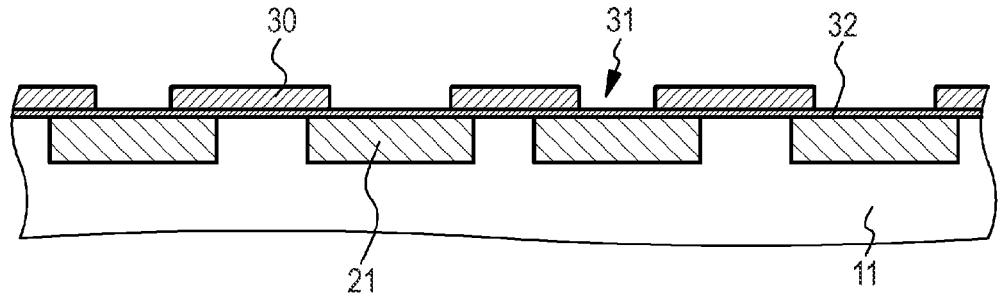
FIG. 3D is a schematic partial end view of pixel regions and subpixel regions in a modification of the two-dimensional solid-state imaging device of Example 1 taken along the arrow of FIG. 5.
Figure 5:
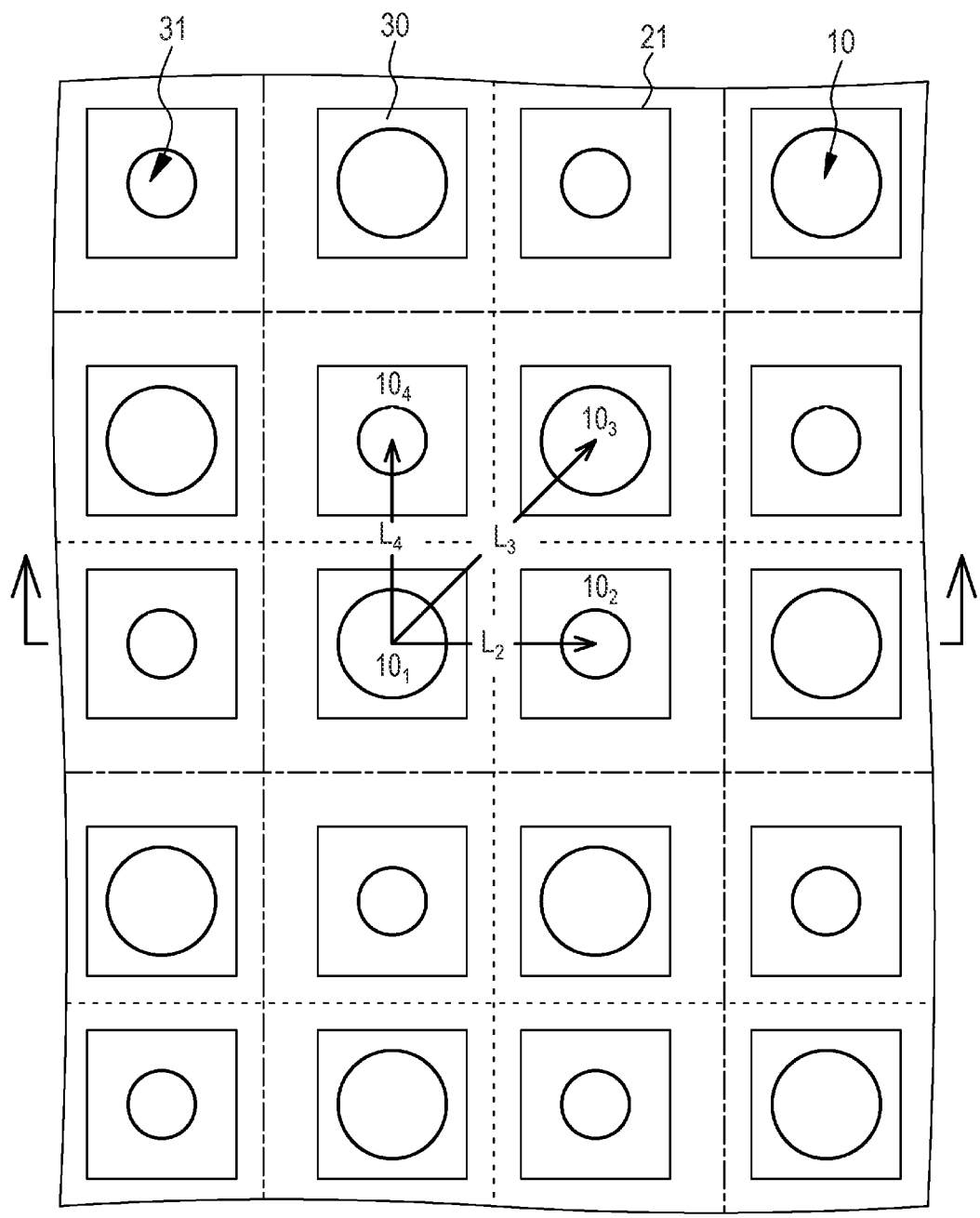
FIG. 5 is a diagram schematically showing arrangement of pixel regions and subpixel regions in a modification of the two-dimensional solid-state imaging device of Example 1.

FIG. 5 schematically shows the arrangement of the pixel regions and the subpixel regions. FIG. 3D is a schematic partial end view of the pixel regions and the subpixel regions taken along the arrow of FIG. 5. As shown in FIG. 3D, the opening size of the opening 31 differs between the subpixel regions.

The two-dimensional solid-state imaging device of Example 1 can be basically manufactured by the same method as the two-dimensional solid-state imaging device of the related art, except that the metal layer 30 with the opening 31 is formed on the insulating film 32. Microfabrication of the metal layer 30 can be easily achieved by using a manufacturing technology of a semiconductor device. For example, the description of the manufacturing method of the two-dimensional solid-state imaging device of Example 1 will be omitted. The same is applied to two-dimensional solid-state imaging devices of Examples 2 to 7 described below.

In the two-dimensional solid-state imaging device of Example 1, the resonance state is generated on the basis of surface plasmon polariton excited by the incoming electromagnetic wave (generation of surface plasmon polariton resonance), and near-field light generated near the opening 31 in the resonance state (near-field light generated by surface plasmon polariton resonance) is converted to an electrical signal by the photoelectric conversion element 21. For this reason, a two-dimensional solid-state imaging device having high sensitivity and a minute opening size can be realized. In addition, each pixel region includes a plurality of subpixel regions 10, and the opening 31 is provided at a portion of the metal layer 30 in each subpixel region 10. Therefore, the distance between the openings is optimized, such that near-field light corresponding to different wavelength components can be detected in the respective subpixel regions 10, and color component can be reliably reproduced. Furthermore, in the two-dimensional solid-state imaging device of Example 1, near-field light is excited on the basis of the distance between the openings provided in the metal layer 30 and detected, so there is no relationship between the thickness of the photoelectric conversion element 21 and the detection wavelength. Near-field light reaches only a region with only the wavelength of the electromagnetic wave, so the thickness of the photoelectric conversion element 21 can be sufficiently small. Furthermore, the opening size of the opening 31 is smaller than the wavelength of the incoming electromagnetic wave, so the opening area of the photoelectric conversion element 21 can be reduced, as compared with the two-dimensional solid-state imaging device of the related art. As a result, the number of pixels per unit area can be significantly increased while the area of the entire photoelectric conversion element can be maintained.

Example 2

Example 2 is a modification of Example 1. In Example 1, the center of the opening 31 of each of the four subpixel regions in one pixel region is located at the apex of the virtual square. Meanwhile, in Example 3, the value of M is 3, and the center of the opening 31 of each of the four subpixel regions in one pixel region is located at the apex of a virtual rectangle.

Figure 6:
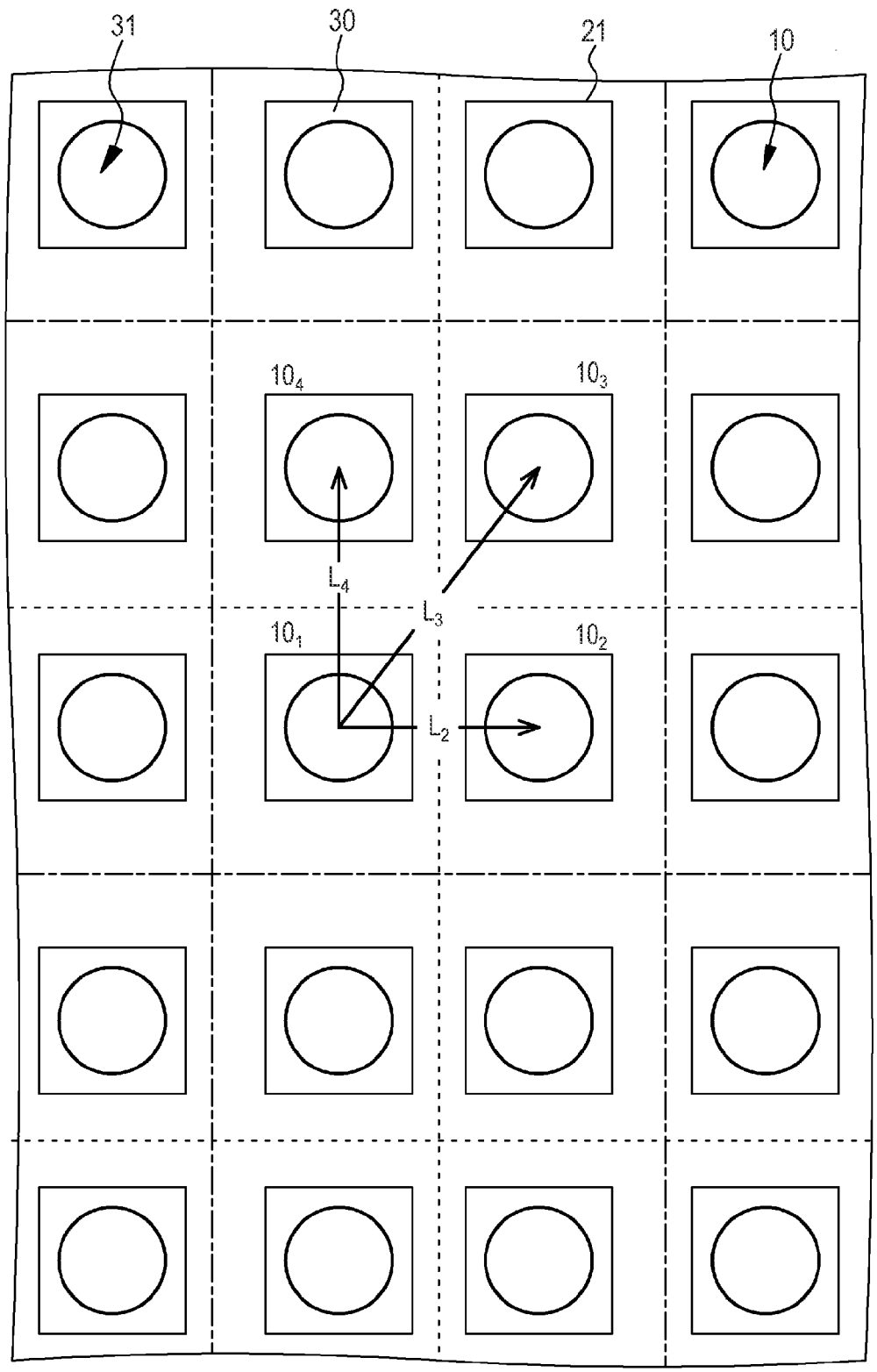
FIG. 6 is a diagram schematically showing arrangement of pixel regions and subpixel regions in a two-dimensional solid-state imaging device of Example 2.

Specifically, as schematically shown in FIG. 6 regarding the arrangement of the pixel regions and the subpixel regions, the center of the opening 31 of each of the four subpixel regions in one pixel region is located at the apex of the virtual rectangle, and near-field light corresponding to three wavelength components due to surface plasmon polariton resonance excited depending on three wavelength components of the incoming electromagnetic wave and three distances $L_m$ (specifically, m=2, m=3, and m=4) is converted to an electrical signal by the photoelectric conversion elements 21 in the first subpixel region $10_1$ and the m-th subpixel region $10_m$.

That is, the distance $L_2$ between the center of the opening 31 of the first subpixel region $10_1$ and the center of the opening 31 of the second subpixel region $10_2$ defines the first inter-center distance $D_1$ between the openings of adjacent subpixel regions, and further defines a first wavelength component of the incoming electromagnetic wave. Then, near-field light corresponding to the first wavelength component due to surface plasmon polariton resonance excited depending on the first distance $D_1$ and the first wavelength component of the incoming electromagnetic wave is converted to an electrical signal by the photoelectric conversion elements 21 in the first subpixel region $10_1$ and the second subpixel region $10_2$. In addition, the distance $L_3$ between the center of the opening 31 of the first subpixel region $10_1$ and the center of the opening 31 of the third subpixel region $10_3$ defines the second inter-center distance $D_2$ ($\neq D_1$) between the openings in adjacent subpixel regions, and further defines a second wavelength component of the incoming electromagnetic wave. Then, near-field light corresponding to the second wavelength component due to surface plasmon polariton resonance excited depending on the second distance $D_2$ and the second wavelength component of the incoming electromagnetic wave is converted to an electrical signal by the photoelectric conversion elements 21 in the first subpixel region $10_1$ and the third subpixel region $10_3$. Furthermore, the distance $L_4$ between the center of the opening 31 of the first subpixel region $10_1$ and the center of the opening 31 of the fourth subpixel region $10_4$ defines the third inter-center distance $D_3$ ($\neq D_1$ and $\neq D_2$) between the openings of adjacent subpixel regions, and further defines a third wavelength component of the incoming electromagnetic wave. Then, near-field light corresponding to the third wavelength component due to surface plasmon polariton resonance excited depending on the third distance $D_3$ and the third wavelength component of the incoming electromagnetic wave is converted to an electrical signal by the photoelectric conversion elements 21 in the first subpixel region $10_1$ and the fourth subpixel region $10_4$.

The same is applied to when the second subpixel region is regarded as the first subpixel region $10_1$, when the third subpixel region is regarded as the first subpixel region $10_1$, and when the fourth subpixel region is regarded as the first subpixel region $10_1$.

Except for the above-described points, the configuration and structure of the two-dimensional solid-state imaging device of Example 2 may be the same as the two-dimensional solid-state imaging device of Example 1, and thus detailed description thereof will not be repeated.

Example 3

Example 3 is also a modification of Example 1. In Example 3, the value of M is 3, and the center of the opening 31 of each of four subpixel regions in one pixel region is located at the apex of the a virtual parallelogram.

Figure 7:
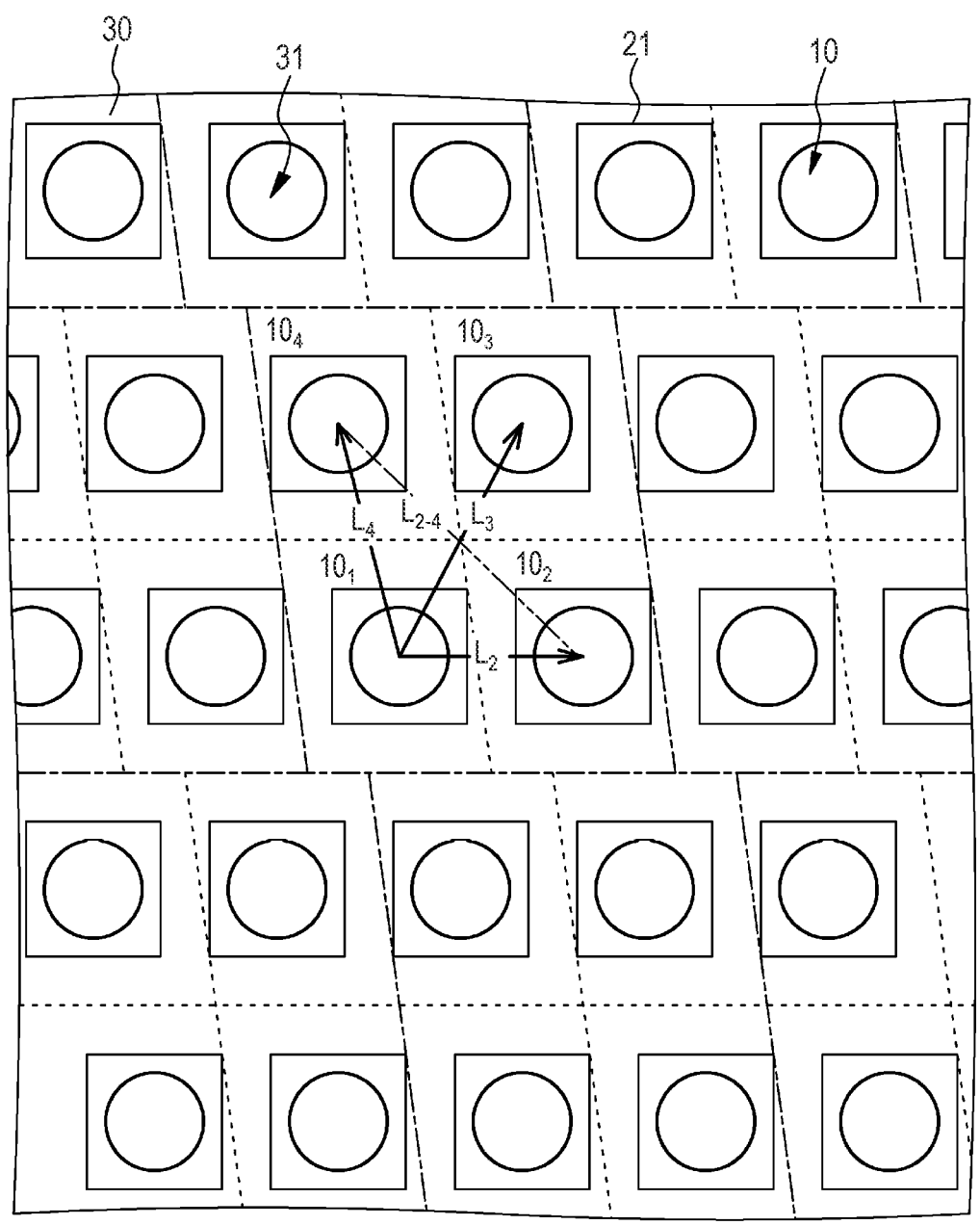
FIG. 7 is a diagram schematically showing arrangement of pixel regions and subpixel regions in a two-dimensional solid-state imaging device of Example 3.

Specifically, as schematically shown in FIG. 7 regarding the arrangement of the pixel regions and the subpixel regions, the center of the opening 31 of each of the four subpixel regions in one pixel region is located at the apex of the virtual parallelogram, and near-field light corresponding to three wavelength components due to surface plasmon polariton resonance excited depending on three wavelength components of the incoming electromagnetic wave and three distances $L_m$ (specifically, m=2, m=3, and m=4) is converted to an electrical signal by the photoelectric conversion elements 21 in the first subpixel region $10_1$ and the m-th subpixel region $10_m$. This example is the same as Example 2 where the center of the opening 31 of each of the four subpixel regions in one pixel region is located at the apex of the virtual rectangle.

Alternatively, the inter-center distance between the openings of adjacent subpixel regions is further optimized, thereby implementing the following embodiment. That is, near-field light corresponding to four wavelength components due to surface plasmon polariton resonance excited depending on four wavelength component of the incoming electromagnetic wave and four distances $L_m$ (specifically, m=2, m=3, and m=4) is converted to an electrical signal by the photoelectric conversion elements 21 in the first subpixel region $10_1$ and the m-th subpixel region $10_m$.

Specifically, the distance $L_2$ between the center of the opening 31 of the first subpixel region $10_1$ and the center of the opening 31 of the second subpixel region $10_2$ defines a first inter-center distance $D_1$ between the openings of adjacent subpixel regions, and further defines a first wavelength component of the incoming electromagnetic wave. Then, near-field light corresponding to the first wavelength component due to surface plasmon polariton resonance excited depending on the first distance $D_1$ and the first wavelength component of the incoming electromagnetic wave is converted to an electrical signal by the photoelectric conversion elements 21 in the first subpixel region $10_1$ and the second subpixel region $10_2$. In addition, the distance $L_3$ between the center of the opening 31 of the first subpixel region $10_1$ and the center of the opening 31 of the third subpixel region $10_3$ defines a second inter-center distance $D_2$ ($\neq D_1$) between the openings of adjacent subpixel regions, and further defines a second wavelength component of the incoming electromagnetic wave. Then, near-field light corresponding to the second wavelength component due to surface plasmon polariton resonance excited depending on the second distance $D_2$ and the second wavelength component of the incoming electromagnetic wave is converted to an electrical signal by the photoelectric conversion elements 21 in the first subpixel region $10_1$ and the third subpixel region $10_3$. Furthermore, the distance $L_4$ between the center of the opening 31 of the first subpixel region $10_1$ and the center of the opening 31 of the fourth subpixel region $10_4$ defines a third inter-center distance $D_3$ ($\neq D_1$ and $\neq D_2$) between the openings of adjacent subpixel regions, and further defines a third wavelength component of the incoming electromagnetic wave. Then, near-field light corresponding to the third wavelength component due to surface plasmon polariton resonance excited depending on the third distance $D_3$ and the third wavelength component of the incoming electromagnetic wave is converted to an electrical signal by the photoelectric conversion elements 21 in the first subpixel region $10_1$ and the fourth subpixel region $10_4$. Furthermore, the distance $L_{2-4}$ (see FIG. 7) between the center of the opening 31 of the second subpixel region $10_2$ and the center of the opening 31 of the fourth subpixel region $10_4$ defines a fourth inter-center distance $D_4$ ($\neq D_1$, $\neq D_2$, and $\neq D_3$) between the openings of adjacent subpixel regions, and further defines a fourth wavelength component of the incoming electromagnetic wave. Then, near-field light corresponding to the fourth wavelength component due to surface plasmon polariton resonance excited depending on the fourth distance $D_4$ and the fourth wavelength component of the incoming electromagnetic wave is converted to an electrical signal by the photoelectric conversion elements 21 in the second subpixel region $10_2$ and the fourth subpixel region $10_4$. In this case, the value of $P_0$ may be 3, such that the wavelength components corresponding to near-field light excited by the distances $D_2$, $D_3$, and $D_4$ which are defined by the distances $L_2$, $L_3$, and $L_4$ are converted to electrical signals by the respective photoelectric conversion elements. In addition, the value of $P_0$ may be 1, such that the photoelectric conversion element detects near-field light due to the resonance state between each inter-opening distance and the corresponding wavelength of the electromagnetic wave in a mixed state.

The same is applied to when the third subpixel region is regarded as the first subpixel region $10_1$, and when the fourth subpixel region is regarded to as the second subpixel region $10_2$.

Except for the above-described points, the configuration and structure of the two-dimensional solid-state imaging device of Example 4 may be the same as the configuration and structure of the two-dimensional solid-state imaging device of Example 1, and thus detailed description thereof will not be repeated.

Example 4

Example 4 is a modification of Example 1. In Example 4, the value of M is 3, and the center of the opening 31 of each of the four subpixel regions in one pixel region is located at the apex of an irregular tetragon. The term "irregular tetragon" means that in a tetragon ABCD, AB, AC, AD, BC, CD, and BD are different in length. In this case, near-field light is detected as described below.

That is, the distance $L_2$ between the center of the opening 31 of the first subpixel region $10_1$ and the center of the opening of the second subpixel region $10_2$ defines a first inter-center distance $D_1$ between the openings of adjacent subpixel regions, and further defines a first wavelength component of the incoming electromagnetic wave. Then, near-field light corresponding to the first wavelength component due to surface plasmon polariton resonance excited depending on the first distance $D_1$ and the first wavelength component of the incoming electromagnetic wave is converted to an electrical signal by the photoelectric conversion element 21 in the second subpixel region $10_2$.

The distance $L_3$ between the center of the opening 31 of the first subpixel region $10_1$ and the center of the opening of the third subpixel region $10_3$ defines a second inter-center distance $D_2$ ($\neq D_1$) between the openings of adjacent subpixel regions, and further defines a second wavelength component of the incoming electromagnetic wave. Then, near-field light corresponding to the second wavelength component due to surface plasmon polariton resonance excited depending on the second distance $D_2$ and the second wavelength component of the incoming electromagnetic wave is converted to an electrical signal by the photoelectric conversion element 21 in the third subpixel region $10_3$.

The distance $L_4$ between the center of the opening 31 of the first subpixel region $10_1$ and the center of the opening of the fourth subpixel region $10_4$ defines a third inter-center distance $D_3$ ($\neq D_1$, $\neq D_2$) between the openings of adjacent subpixel regions, and further defines a third wavelength component of the incoming electromagnetic wave. Then, near-field light corresponding to the third wavelength component due to surface plasmon polariton resonance excited depending on the third distance $D_3$ and the third wavelength component of the incoming electromagnetic wave is converted to an electrical signal by the photoelectric conversion element 21 in the fourth subpixel region $10_4$.

Except for the above-described points, the configuration and structure of the two-dimensional solid-state imaging device of Example 4 may be the same as the configuration and structure of the two-dimensional solid-state imaging device of Example 1, and thus detailed description thereof will not be repeated.

Example 5

Figure 8:
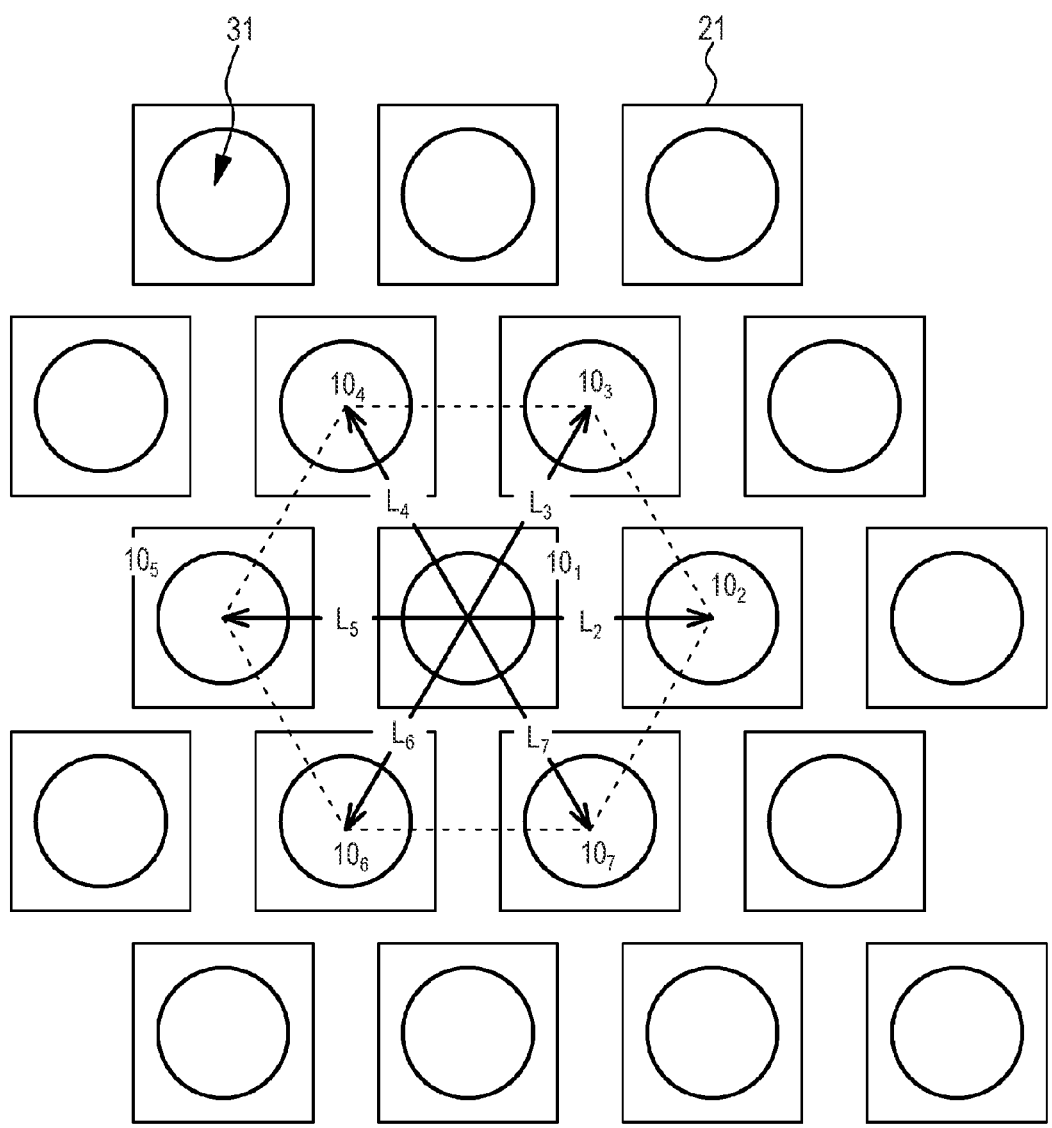
FIG. 8 is a diagram schematically showing arrangement of pixel regions and subpixel regions in a two-dimensional solid-state imaging device of Example 5.

Example 5 is a modification of Example 1 and relates to the second configuration. FIG. 8 schematically shows the arrangement of the pixel regions and the subpixel regions in the two-dimensional solid-state imaging device of Example 5.

In the two-dimensional solid-state imaging device of Example 5 or Examples 6 and 7 described above, each pixel region includes a first subpixel region $10_1$ and N subpixel regions surrounding the first subpixel region $10_1$, each subpixel region has one opening 31, and when the distance from the center of the opening 31 of the first subpixel region to the center of the opening 31 of the n-th subpixel region [where n is 2, 3, . . . , and (N+1)] is $L_n$, near-field light corresponding to a wavelength component depending on a wavelength component of the incoming electromagnetic wave and the distance $L_n$ is converted to an electrical signal by the photoelectric conversion element 21.

In the two-dimensional solid-state imaging device of Example 5 or Examples 6 and 7 described below, near-field light corresponding to wavelength components depending on q (where q is a natural number equal to or greater 1 and equal to or smaller than N) wavelength components of the incoming electromagnetic wave and q' (where q' is a natural number equal to or greater 1 and equal to or smaller than N) distances $L_n$ is converted to an electrical signal by the photoelectric conversion element 21 in at least the n-th subpixel region.

In the two-dimensional solid-state imaging device of Example 5, the value of N is 6, the center of the opening 31 of each of the N subpixel regions surrounding the first subpixel region in one pixel region is located at the apex of a virtual regular hexagon, and the center of the opening 31 of the first subpixel region is located at the center of the virtual regular hexagon.

Specifically, in Example 5, near-field light corresponding to one or more, or N or less (for example, one) wavelength components due to surface plasmon polariton resonance excited depending on one or more, or N or less (for example, one) wavelength components of the incoming electromagnetic wave and one distance $L_m$ is converted to an electrical signal by the photoelectric conversion elements 21 in the first subpixel region and the n-th subpixel region. The two-dimensional solid-state imaging device of Example 5 has sensitivity to a single color. In order to obtain near-field light corresponding to two or more wavelength components, a medium (refractive index variable layer) filling the opening 31 in the respective subpixel regions may differ. The same is applied later.

That is, a medium filling the openings 31 of the second subpixel region $10_2$ and the fifth subpixel region $10_5$, a medium filling the openings 31 of the third subpixel region $10_3$ and the sixth subpixel region $10_6$, and a medium filling the openings 31 of the fourth subpixel region $10_4$ and the seventh subpixel region $10_7$ are appropriately varied. Then, the distance $L_2$ between the center of the opening 31 of the first subpixel region $10_1$ and the centers of the openings 31 of the second subpixel region $10_2$ and the fifth subpixel region $10_5$ defines a first inter-center distance $D_1$ between the openings of adjacent subpixel regions, and further defines a first wavelength component of the incoming electromagnetic wave. Then, near-field light corresponding to the first wavelength component due to surface plasmon polariton resonance excited depending on the first distance $D_1$ and the first wavelength component of the incoming electromagnetic wave is converted to an electrical signal by the photoelectric conversion elements 21 in the first subpixel region $10_1$, the second subpixel region $10_2$, and the fifth subpixel region $10_5$. In addition, the distance $L_3$ between the center of the opening 31 of the first subpixel region $10_1$ and the centers of the openings 31 of the third subpixel region $10_3$ and the sixth subpixel region $10_6$ defines a second inter-center distance $D_2$ ($\neq D_1$) between the openings of adjacent subpixel regions, and further defines a second wavelength component of the incoming electromagnetic wave. Then, near-field light corresponding to the second wavelength component due to surface plasmon polariton resonance excited depending on the second distance $D_2$ and the second wavelength component of the incoming electromagnetic wave is converted to an electrical signal by the photoelectric conversion elements 21 in the first subpixel region $10_1$, the third subpixel region $10_3$, and the sixth subpixel region $10_6$. Furthermore, the distance $L_4$ between the center of the opening 31 of the first subpixel region $10_1$ and the centers of the openings 31 of the fourth subpixel region $10_4$ and the seventh subpixel region $10_7$ defines a third inter-center distance $D_3$ ($\neq D_1$ and $\neq D_2$) between the openings of adjacent subpixel regions, and further defines a third wavelength component of the incoming electromagnetic wave. Then, near-field light corresponding to the third wavelength component due to surface plasmon polariton resonance excited depending on the third distance $D_3$ and the third wavelength component of the incoming electromagnetic wave is converted to an electrical signal by the photoelectric conversion elements 21 in the first subpixel region $10_1$, the fourth subpixel region $10_4$, and the seventh subpixel region $10_7$.

Except for the above-described points, the configuration and structure of the two-dimensional solid-state imaging device of Example 5 may be the same as the configuration and structure of the two-dimensional solid-state imaging device of Example 1, and thus detailed description thereof will not be repeated.

Example 6

Figure 9:
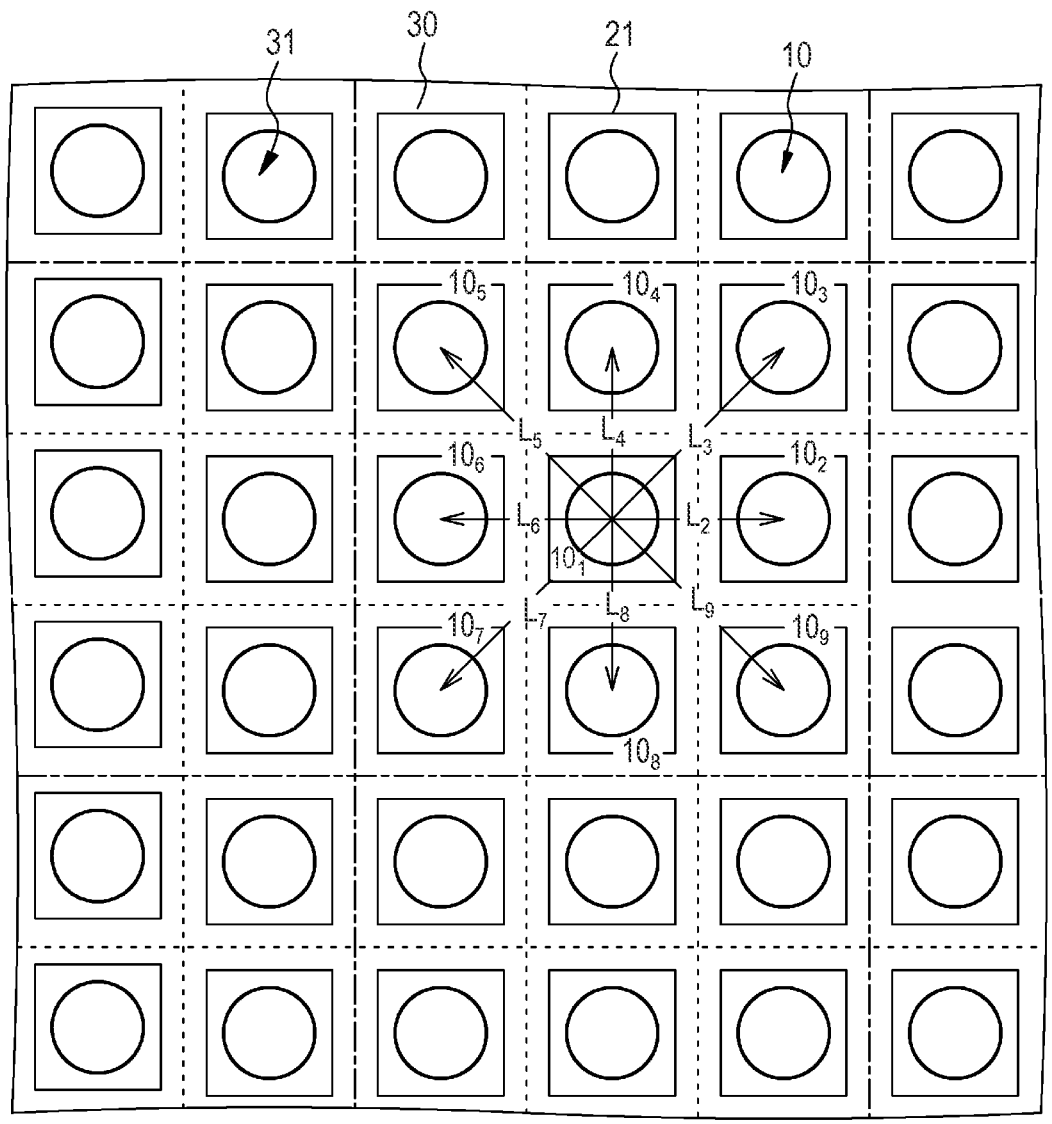
FIG. 9 is a diagram schematically showing arrangement of pixel regions and subpixel regions in a two-dimensional solid-state imaging device of Example 6.
Figure 10:
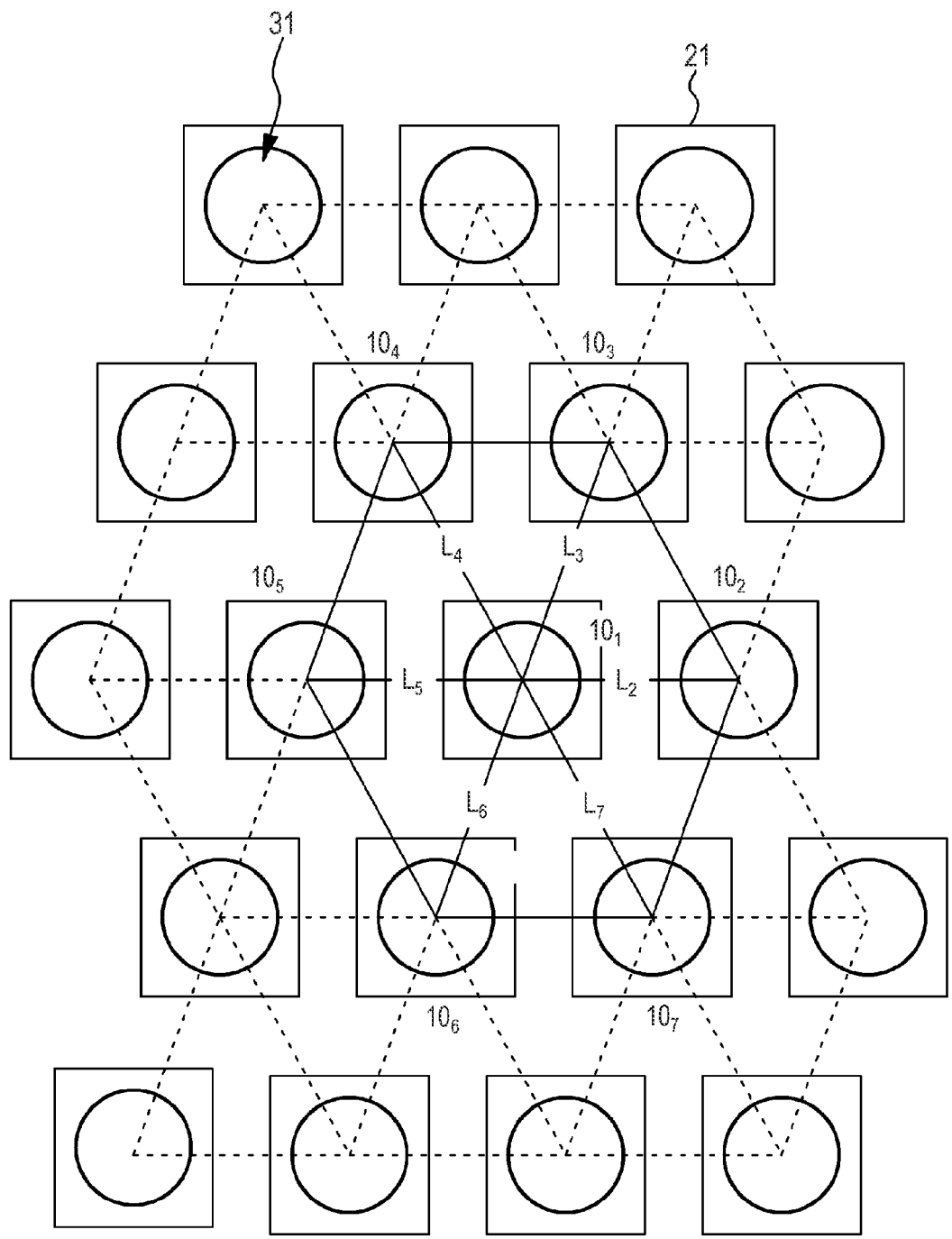
FIG. 10 is a diagram schematically showing arrangement of pixel regions and subpixel regions in a modification of the two-dimensional solid-state imaging device of Example 6.

Example 6 is a modification of Example 5. In Example 6, the value of N is 8, and the center of the opening 31 of each of four adjacent subpixel regions in one pixel region is located at the apex of a virtual square, a virtual rectangle, or a virtual parallelogram. The arrangement of the pixel regions and the subpixel regions in the two-dimensional solid-state imaging device of Example 6 is schematically shown in FIG. 9 (an example where the center of the opening is located at the apex of a virtual square) or FIG. 10 (an example where the center of the opening is located at the apex of a virtual parallelogram).

Specifically, when the value of N is 8, and the center of the opening 31 of each of four adjacent subpixel regions in one pixel region is located at the apex of a virtual square (an example of FIG. 9), near-field light corresponding to two or more, or N or less wavelength components due to surface plasmon polariton resonance excited depending on two or more, or N or less wavelength components of the incoming electromagnetic wave and two distances $L_m$ (specifically, n=2, 4, 6, and 8, and n=3, 5, 7, and 9) may be converted to an electrical signal by the photoelectric conversion elements 21 in the first subpixel region and the n-th subpixel region.

One pixel region includes a first subpixel region $10_1$, a second subpixel region $10_2$, a third subpixel region $10_3$, a fourth subpixel region $10_4$, a fifth subpixel region $10_5$, a sixth subpixel region $10_6$, a seventh subpixel region $10_7$, an eighth subpixel region $10_8$, and a ninth subpixel region $10_9$. With regard to four adjacent subpixel regions in one pixel region, (the first subpixel region $10_1$, the second subpixel region $10_2$, the third subpixel region $10_3$, and the fourth subpixel region $10_4$) are grouped. In addition, (the first subpixel region $10_1$, the fourth subpixel region $10_4$, the fifth subpixel region $10_5$, and the sixth subpixel region $10_6$) are grouped. Furthermore, (the first subpixel region $10_1$, the sixth subpixel region $10_6$, the seventh subpixel region $10_7$, and the eighth subpixel region $10_8$) are grouped. Furthermore, (the first subpixel region $10_1$, the eighth subpixel region $10_8$, the ninth subpixel region $10_9$, and the second subpixel region $10_2$) are grouped. The same is applied later.

That is, the distance $L_2$ between the center of the opening 31 of the first subpixel region $10_1$ and the center of the opening 31 of the second subpixel region $10_2$, the distance $L_4$ between the center of the opening 31 of the first subpixel region $10_1$ and the center of the opening 31 of the fourth subpixel region $10_4$, the distance $L_6$ between the center of the opening 31 of the first subpixel region $10_1$ and the center of the opening 31 of the sixth subpixel region $10_6$, and the distance $L_8$ between the center of the opening 31 of the first subpixel region $10_1$ and the center of the opening 31 of the eighth subpixel region $10_8$ define a first inter-center distance $D_1$ between the openings of adjacent subpixel regions, and further define a first wavelength component of the incoming electromagnetic wave. Then, near-field light corresponding to the first wavelength component due to surface plasmon polariton resonance excited depending on the first distance $D_1$ and the first wavelength component of the incoming electromagnetic wave is converted to an electrical signal by the photoelectric conversion elements 21 in the first subpixel region $10_1$, the second subpixel region $10_2$, the fourth subpixel region $10_4$, the sixth subpixel region $10_6$, and the eighth subpixel region $10_8$. In addition, the distance $L_3$ between the center of the opening 31 of the first subpixel region $10_1$ and the center of the opening 31 of the third subpixel region $10_3$, the distance $L_5$ between the center of the opening 31 of the first subpixel region $10_1$ and the center of the opening 31 of the fifth subpixel region $10_5$, the distance $L_7$ between the center of the opening 31 of the first subpixel region $10_1$ and the center of the opening 31 of the seventh subpixel region $10_7$, and the distance $L_9$ between the center of the opening 31 of the first subpixel region $10_1$ and the center of the opening $31$ of the ninth subpixel region $10_9$ define a second inter-center distance $D_2$ ($\neq D_1$) between the openings of adjacent subpixel regions, and further define a second wavelength component of the incoming electromagnetic wave. Then, near-field light corresponding to the second wavelength component due to surface plasmon polariton resonance excited depending on the second distance $D_2$ and the second wavelength component of the incoming electromagnetic wave is converted to an electrical signal by the photoelectric conversion elements $21$ in the first subpixel region $10_1$, the third subpixel region $10_3$, the fifth subpixel region $10_5$, the seventh subpixel region $10_7$, and the ninth subpixel region $10_9$.

Alternatively, when the value of N is 8, and the center of the opening $31$ of each of four adjacent subpixel regions in one pixel region is located at the apex of a virtual rectangle, near-field light corresponding to three or more, or N or less wavelength components due to surface plasmon polariton resonance excited depending on three or more, or N or less wavelength components of the incoming electromagnetic wave and three distances $L_m$ is converted to an electrical signal by the photoelectric conversion elements $21$ in the first subpixel region and the n-th subpixel region.

That is, the distance $L_2$ between the center of the opening $31$ of the first subpixel region $10_1$ and the center of the opening $31$ of the second subpixel region $10_2$, and the distance $L_6$ between the center of the opening $31$ of the first subpixel region $10_1$ and the center of the opening $31$ of the sixth subpixel region $10_6$ define a first inter-center distance $D_1$ between the openings of adjacent subpixel regions, and further define a first wavelength component of the incoming electromagnetic wave. Then, near-field light corresponding to the first wavelength component due to surface plasmon polariton resonance excited depending on the first distance $D_1$ and the first wavelength component of the incoming electromagnetic wave is converted to an electrical signal by the photoelectric conversion elements $21$ in the first subpixel region $10_1$, the second subpixel region $10_2$, and the sixth subpixel region $10_6$. In addition, the distance $L_4$ between the center of the opening $31$ of the first subpixel region $10_1$ and the center of the opening $31$ of the fourth subpixel region $10_4$, and the distance $L_8$ between the center of the opening $31$ of the first subpixel region $10_1$ and the center of the opening $31$ of the eighth subpixel region $10_8$ define a second inter-center distance $D_2$ ($\neq D_1$) between the openings of adjacent subpixel regions, and further define a second wavelength component of the incoming electromagnetic wave. Then, near-field light corresponding to the second wavelength component due to surface plasmon polariton resonance excited depending on the second distance $D_2$ and the second wavelength component of the incoming electromagnetic wave is converted to an electrical signal by the photoelectric conversion elements $21$ in the first subpixel region $10_1$, the fourth subpixel region $10_4$, and the eighth subpixel region $10_8$. Furthermore, the distance $L_3$ between the center of the opening $31$ of the first subpixel region $10_1$ and the center of the opening $31$ of the third subpixel region $10_3$, the distance $L_5$ between the center of the opening $31$ of the first subpixel region $10_1$ and the center of the opening $31$ of the fifth subpixel region $10_5$, the distance $L_7$ between the center of the opening $31$ of the first subpixel region $10_1$ and the center of the opening $31$ of the seventh subpixel region $10_7$, and the distance $L_9$ between the center of the opening $31$ of the first subpixel region $10_1$ and the center of the opening $31$ of the ninth subpixel region $10_9$ define a third inter-center distance $D_3$ ($\neq D_1$ and $\neq D_2$) between the openings of adjacent subpixel regions, and further define a third wavelength component of the incoming electromagnetic wave. Then, near-field light corresponding to the third wavelength component due to surface plasmon polariton resonance excited depending on the third distance $D_3$ and the third wavelength component of the incoming electromagnetic wave is converted to an electrical signal by the photoelectric conversion elements $21$ in the first subpixel region $10_1$, the third subpixel region $10_3$, the fifth subpixel region $10_5$, the seventh subpixel region $10_7$, and the ninth subpixel region $10_9$.

Alternatively, when the value of N is 8, and the center of the opening $31$ of each of four adjacent subpixel regions in one pixel region is located at the apex of a virtual parallelogram (see FIG. 10), near-field light corresponding to three or more, or N or less wavelength components due to surface plasmon polariton resonance excited depending on three or more, or N or less wavelength components of the incoming electromagnetic wave and three or four distances $L_m$ may be converted to an electrical signal by the photoelectric conversion elements $21$ in the first subpixel region and the n-th subpixel region. This example may be basically the same as when the center of the opening $31$ of each of the eight subpixel regions in one pixel region is located at the apex of the virtual rectangle, or as described in Example 3.

In Example 6 or Example 5 described above, the inter-center distance D between the openings of adjacent subpixel regions is determined such that the resonance state is not generated on the basis of surface plasmon polariton between adjacent pixel regions. However, the invention is not limited thereto. For example, the inter-center distance D between the openings of adjacent subpixel regions may be determined such that the resonance state is generated on the basis of surface plasmon polariton between adjacent pixel regions. In this case, in the example of FIG. 9, a pixel region group includes four pixel regions, a first pixel region having a first subpixel region $10_1$, a second subpixel region $10_2$, a third subpixel region $10_3$, and a fourth subpixel region $10_4$, a second pixel region having a first subpixel region $10_1$, a fourth subpixel region $10_4$, a fifth subpixel region $10_5$, and a sixth subpixel region $10_6$, a third pixel region having a first subpixel region $10_1$, a sixth subpixel region $10_6$, a seventh subpixel region $10_7$, and an eighth subpixel region $10_8$, and a fourth pixel region having a first subpixel region $10_1$, an eighth subpixel region $10_8$, a ninth subpixel region $10_9$, and a second subpixel region $10_2$. The pixel region group may be regarded as the pixel region in Example 6. The same is applied to other arrangements of the subpixel regions.

Except for the above-described points, the configuration and structure of the two-dimensional solid-state imaging device of Example 6 may be the same as the configuration and structure of the two-dimensional solid-state imaging device of Example 1, and thus detailed description thereof will not be repeated.

Example 7

Figure 11A:
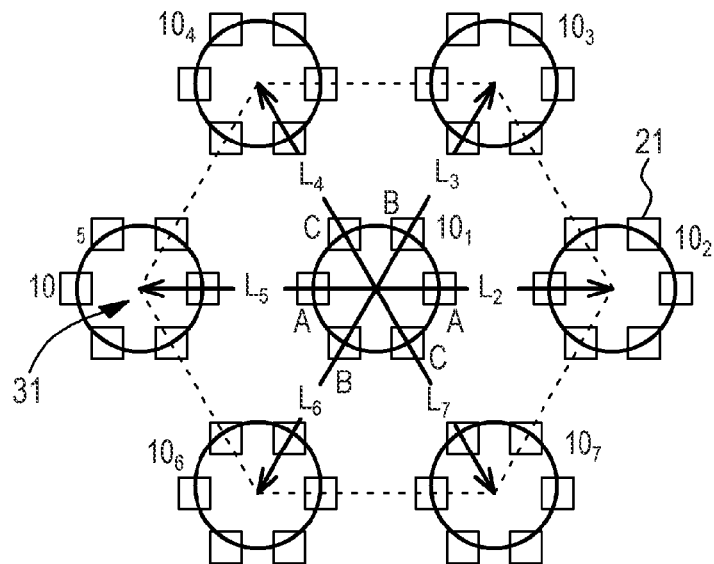
FIGS. 11A and 11B are diagrams schematically showing arrangement of pixel regions and subpixel regions in a two-dimensional solid-state imaging device of Example 7.
Figure 11B:
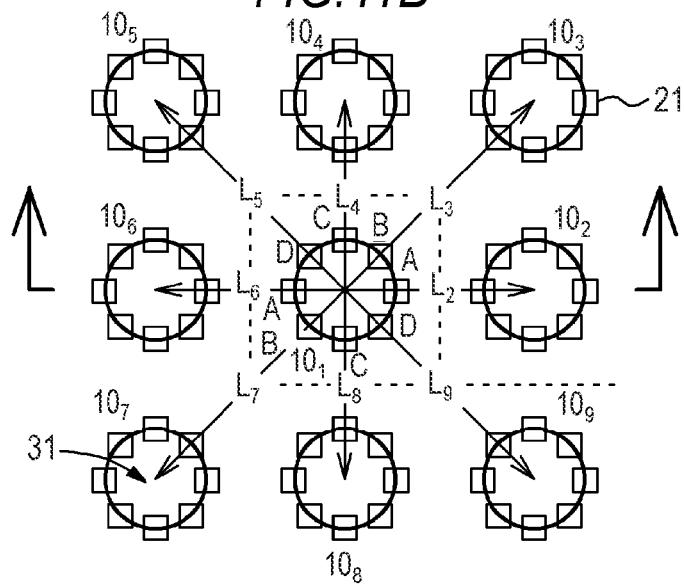
Figure 11C:
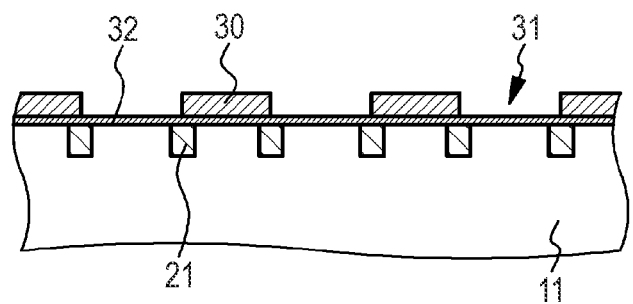
FIG. 11C is a schematic partial end view of the pixel regions and the subpixel regions in the two-dimensional solid-state imaging device of Example 7 taken along the arrow of FIG. 11B.
Figure 12:
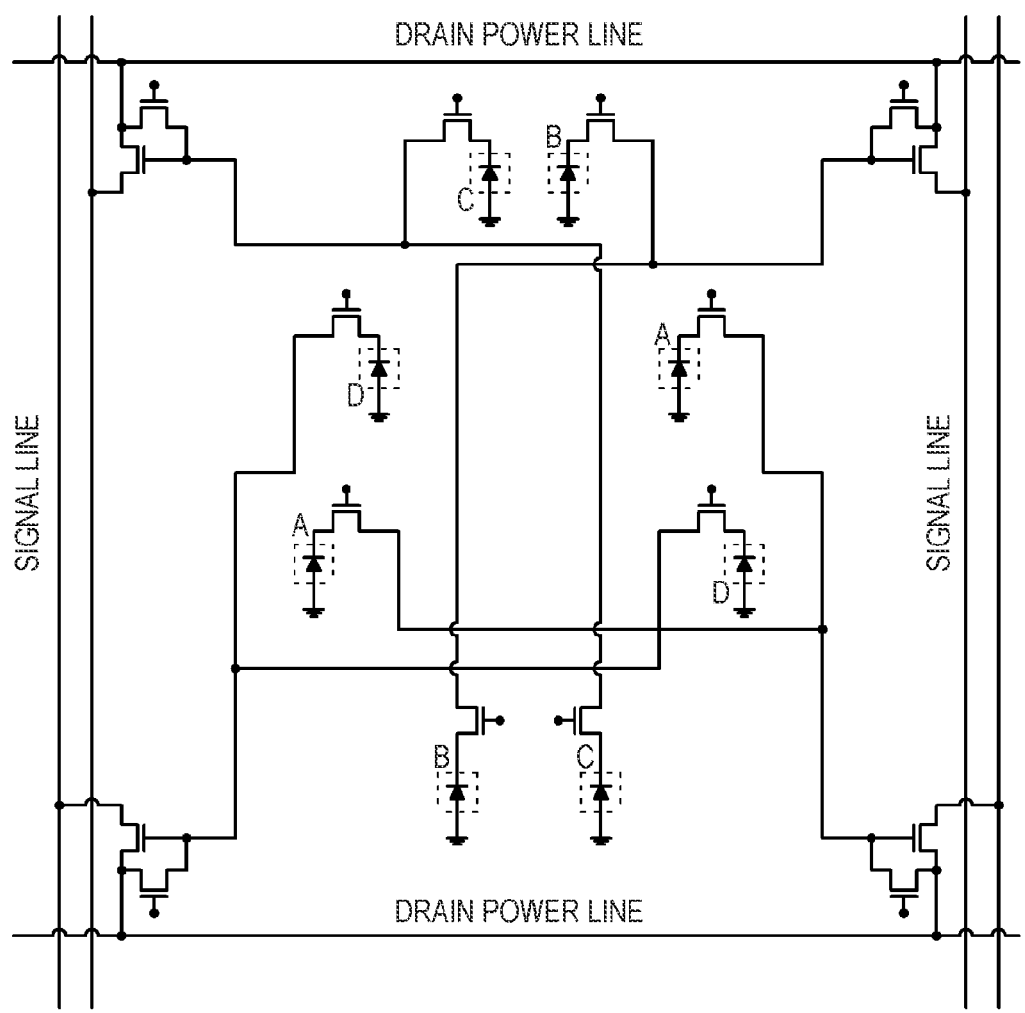
FIG. 12 is an equivalent circuit diagram of one subpixel region in the two-dimensional solid-state imaging device of Example 7.

Example 7 is a modification of Example 1 and relates to the two-dimensional solid-state imaging device according to the second embodiment of the invention. FIGS. 11A and 11B schematically show arrangement of pixel regions and sub-pixel regions in the two-dimensional solid-state imaging device of Example 7. FIG. 11C is a schematic partial end view of the pixel region and the subpixel regions taken along the arrow of FIG. 11B. In FIG. 12, an equivalent circuit diagram of one subpixel region is shown, but the invention is not limited to such a circuit.

In terms of a vertical polarization component and a horizontal polarization component of the incoming electromagnetic wave, near-field light is a TM mode, so surface plasmon polariton (SPP) is excited by the periodic structure of a thin-film metal layer parallel to each polarization component. It has been found that near-field light generated by surface plasmon polariton has strong electric field intensity at the opening edge (edge portion). That is, in a plurality of openings linearly arranged, near-field light having strongest electric field intensity is irradiated onto a spot region having a spread of about several tens nm directly below, and a detectable polarization component varies depending on the arrangement direction of the openings. Accordingly, if the light receiving region of the photoelectric conversion element is arranged below at least a part of portions where a line passing through the centers of the respective openings intersects the edges (edge portions) of two openings, preferably, below both portions (the portions are opposite each other), a polarization component parallel to the line passing through the centers of the two openings can be detected by the photoelectric conversion element.

In the two-dimensional solid-state imaging device of Example 7, a plurality of photoelectric conversion elements 21 are arranged in one opening 31 provided at a portion of the metal layer 30, and a projection image of the edge of the opening 31 is included in the light receiving regions of a plurality of photoelectric conversion elements 21 while a projection image of the opening 31 is not included in the light receiving region of the photoelectric conversion element 21. Then, near-field light generated near the opening 31 in the resonance state is converted to an electrical signal by a plurality of photoelectric conversion elements 21, and information regarding polarization of the incoming electromagnetic wave is acquired. In addition, information regarding the wavelength (color) of the incoming electromagnetic wave corresponding to the periodic interval of the openings 31 is acquired.

In Example 7, the arrangement of the subpixel regions it the same as the arrangement in Example 5. Thus, $2P_0$ photoelectric conversion elements 21 are arranged in one opening 31 in a circular pattern, and the p-th photoelectric conversion element 21 (where p is 1, 2, . . . , and $P_0$) and the (p+$P_0$)th photoelectric conversion element 21 are paired, thereby acquiring information regarding the wavelength and polarization of the incoming electromagnetic wave.

An example shown in FIG. 11A is a modification of Example 5, and the center of the opening of each of N (6) subpixel regions is located at the apex of a virtual regular hexagon. The value of $2P_0$ is 6. That is, the number of $2P_0$ photoelectric conversion elements 21 arranged in one subpixel region is 6. In FIGS. 11A and 11B, $2P_0$ photoelectric conversion elements 21 are shown with respect to one subpixel region.

If the light receiving region of a photoelectric conversion element A is arranged below the portions (two points in each opening) where a line connecting the openings 31 in the first subpixel region $10_1$, the second subpixel region $10_2$, and the fifth subpixel region $10_5$ intersects the edges (edge portions) of the openings 31, a first polarization component parallel to the line passing through the center of the opening can be detected by the photoelectric conversion element A. In addition, if the light receiving region of a photoelectric conversion element B is arranged below the portions (two points in each opening) where a line connecting the openings 31 in the first subpixel region $10_1$, the third subpixel region $10_3$, and the sixth subpixel region $10_6$ intersects the edges (edge portions) of the openings 31, a second polarization component parallel to the line passing through the center of the opening can be detected by the photoelectric conversion element B. Furthermore, if the light receiving region of a photoelectric conversion element C is arranged below the portions (two points in each opening) where a line connecting the openings 31 of the first subpixel region $10_1$, the fourth subpixel region $10_4$, and the seventh subpixel region $10_7$ intersects the edges (edge portions) of the openings 31, a third polarization component parallel to the line connecting the centers of the openings can be detected by the photoelectric conversion element C. Three kinds of information (polarization components) regarding polarization of the incoming electromagnetic wave obtained in such a manner undergo an arithmetic operation, such that the maximum polarization intensity $I_{PL-max}$ and minimum polarization intensity $I_{PL-min}$ of light incoming onto the pixel region, the polarization direction $\theta_{PL-max}$ in which the maximum polarization intensity $I_{PL-max}$ of light incoming onto the pixel region is obtained, and polarization component intensity $I_{PL}$ which is the intensity regarding polarization component can be obtained.

Figure 13:
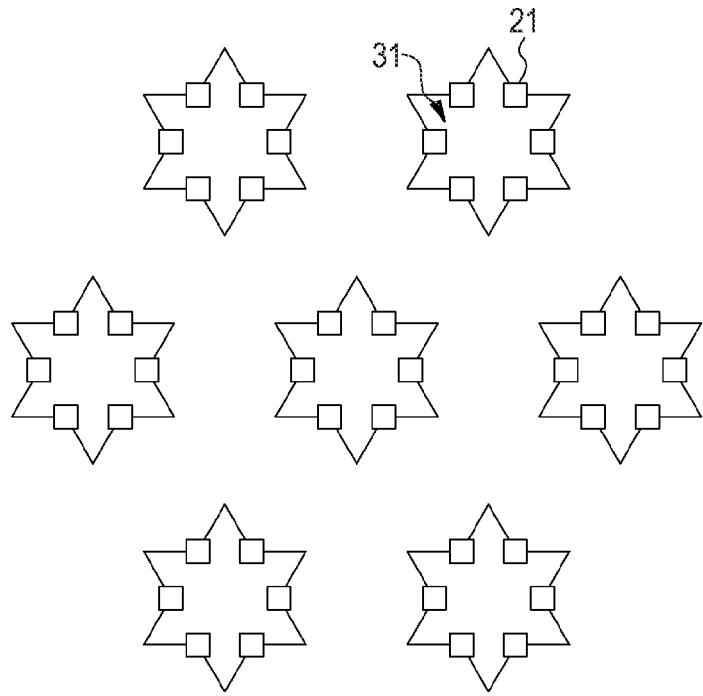
FIG. 13 is a diagram showing a modification of the planar shape of an opening in the two-dimensional solid-state imaging device of Example 7.

Near-field light generated by surface plasmon polariton tends to form a strong electric field at the apex with a pointed top. It is found that this tendency is due to narrowing of a region where electrons move and concentration of an electric field at the apex with a point top. For this reason, as shown in FIG. 13, the planar shape of the opening may be a star such that strong near-field light generated at each apex can be detected. The center of the opening of each of the N (8) subpixel regions may be located at the apex of a virtual regular octagon.

An example of FIG. 11B is a modification of Example 6. In this case, N is 8, and the center of the opening 31 in four adjacent substrate regions in one pixel region is arranged at the apex of a virtual square. The number of $2P_0$ photoelectric conversion elements 21 arranged in one subpixel region is 8.

If the light receiving region of the photoelectric conversion element is arranged below the portions (two points in each opening) where a line connecting the openings 31 of the first subpixel region $10_1$, the second subpixel region $10_2$, and the sixth subpixel region $10_6$ intersects the edges (edge portions) of the openings 31, a first polarization component parallel to the line passing through the center of the opening and near-field light mainly corresponding to the first wavelength component can be detected. In addition, if the light receiving region of the photoelectric conversion element is arranged below the portions (two points in each opening) where a line connecting the openings 31 of the first subpixel region $10_1$, the third subpixel region $10_3$, and the seventh subpixel region $10_7$ intersects the edges (edge portions) of the openings 31, a second polarization component parallel to the line passing through the center of the opening and near-field light mainly corresponding to the second wavelength component can be detected by the photoelectric conversion element. Furthermore, if the light receiving region of the photoelectric conversion element is arranged below the portions (two points in each opening) where a line connecting the openings 31 of the first subpixel region $10_1$, the fourth subpixel region $10_4$, and the eighth subpixel region $10_8$ intersects the edges (edge portions) of the openings 31, a third polarization component parallel to the line passing through the center of the opening and near-field light mainly corresponding to the third wavelength component can be detected by the photoelectric conversion element. Furthermore, if the light receiving region of the photoelectric conversion element is arranged below the portions (two points in each opening) where a line connecting the openings 31 of the first subpixel region $10_1$, the fifth subpixel region $10_5$, and the ninth subpixel region $10_9$ intersects the edges (edge portions) of the openings 31, a fourth polarization component parallel to the line passing through the center of the opening and near-field light mainly corresponding to the fourth wavelength component can be detected by the photoelectric conversion element. Then, four kinds of information (polarization component) regarding polarization of the incoming electromagnetic wave obtained in such a manner undergo an arithmetic operation, such that the maximum polarization intensity $I_{PL-max}$ and minimum polarization intensity $I_{PL-min}$ of light incoming to the pixel region, the polarization direction $\theta_{PL-max}$ in which the maximum polarization intensity $I_{PL-max}$ of light incoming to the pixel region is obtained, and the polarization component intensity $I_{PL}$ which is the intensity regarding the polarization component can be obtained. The separation state of near-field light corresponding to the first wavelength component, near-field light corresponding to the second wavelength component, near-field light corresponding to the third wavelength component, and near-field light corresponding to the fourth wavelength component can be obtained.

In the modification of Example 6 in which the center of the opening 31 of each of four adjacent subpixel regions in one pixel region is located at the apex of the virtual rectangle, or at the apex of the virtual parallelogram, similarly, $2P_0$ (=8) photoelectric conversion elements 21 may be arranged in one subpixel region.

Figure 14:
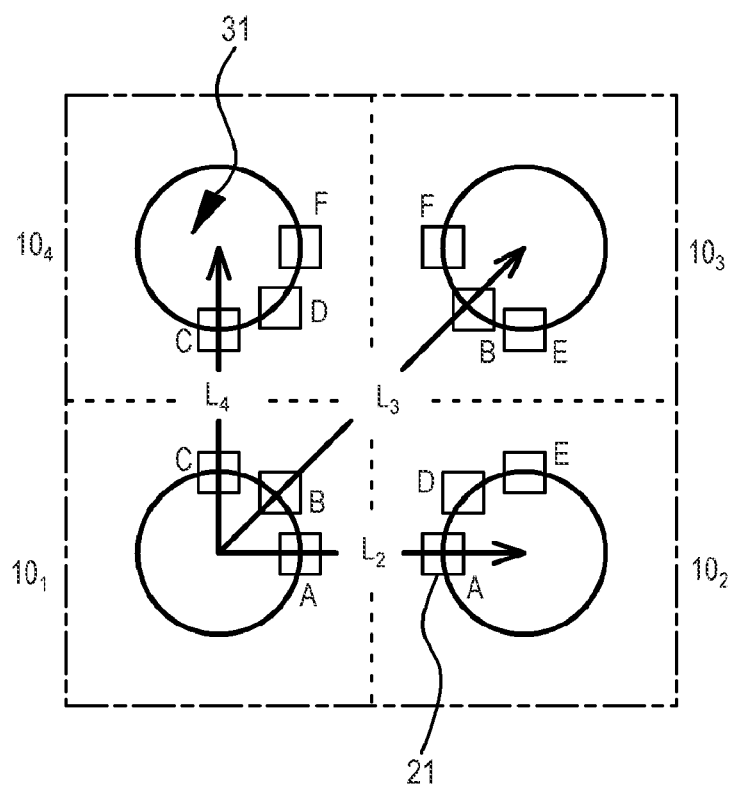
FIG. 14 is a diagram schematically showing arrangement of pixel regions and subpixel regions in another modification of the two-dimensional solid-state imaging device of Example 7.

FIG. 14 schematically shows the arrangement of the pixel regions and the subpixel regions when Example 7 is applied to the two-dimensional solid-state imaging device described in Example 1. In this case, three photoelectric conversion elements A, B, and C are arranged in the first subpixel region $10_1$, and three photoelectric conversion elements A, B, and C are also arranged in each of the second subpixel region $10_2$, the third subpixel region $10_3$, and the fourth subpixel region $10_4$.

The light receiving region of the photoelectric conversion element A is arranged below the portions (one point in each opening) where a line connecting the openings 31 of the first subpixel region $10_1$ and the second subpixel region $10_2$ intersects the edges (edge portions) of the openings 31. The light receiving region of the photoelectric conversion element F is arranged below the portions (one point in each opening) where a line connecting the openings 31 of the third subpixel region $10_3$ and the fourth subpixel region $10_4$ intersects the edges (edge portions) of the openings 31. When these happen, a first polarization component parallel to the line passing through the center of the opening and near-field light mainly corresponding to the first wavelength component can be detected by the photoelectric conversion elements A and F. If the light receiving region of the photoelectric conversion element B is arranged below the portions (one point in each opening) where a line connecting the openings 31 of the first subpixel region $10_1$ and the third subpixel region $10_3$ intersects the edges (edge portions) of the openings 31, a second polarization component parallel to the line passing through the center of the opening and near-field light mainly corresponding to the second wavelength component can be detected by the photoelectric conversion element B. The light receiving region of the photoelectric conversion element C is arranged below the portions (one point in each opening) where a line connecting the openings 31 of the first subpixel region $10_1$ and the fourth subpixel region $10_4$ intersects the edges (edge portions) of the openings 31. The light receiving region of the photoelectric conversion element E is arranged below the portions (one point in each opening) where a line connecting the openings 31 of the second subpixel region $10_2$ and the third subpixel region $10_3$ intersects the edges (edge portions) of the openings 31. When these happen, a third polarization component parallel to the line passing through the center of the opening and near-field light mainly corresponding to the third wavelength component can be detected by the photoelectric conversion elements C and E. If the light receiving region of the photoelectric conversion element D is arranged below the portions (one point in each opening) where a line connecting the openings 31 of the second subpixel region $10_2$ and the fourth subpixel region $10_4$ intersects the edges (edge portions) of the openings 31, a fourth polarization component parallel to the line passing through the center of the opening and near-field light mainly corresponding to the fourth wavelength component can be detected by the photoelectric conversion element D. The separation state of near-field light corresponding to the first wavelength component, near-field light corresponding to the second wavelength component, near-field light corresponding to the third wavelength component, and near-field light corresponding to the fourth wavelength component can obtained.

Similarly, Example 7 may be applied to two-dimensional solid-state imaging device described in each of Examples 2 to 4.

Although the invention has been described in connection with Examples, the invention is not limited to Examples. Although in Examples, a solid-state imaging element has been described which detects the wavelength band of visible light, in a solid-state imaging element which detects an ultraviolet ray or an infrared ray, the distance between the openings is expanded and reduced depending on the wavelength, such that a two-dimensional solid-state imaging device can be obtained which operates with an arbitrary wavelength band. The planar shape of the opening 31 is not limited to a circle or a star but may have an arbitrary planar shape, such as a triangle, a rectangle, a hexagon, a octagon, a rhombus, an ellipse, or a cross. A refractive index variable layer with an uneven periodic structure (also referred to as sub-wavelength structure (see JP-A-2001-108812 or WO2005/101067 A1) having a period smaller than the wavelength of the incoming electromagnetic wave may be provided on the light incoming side of the opening 31.

Figure 15:
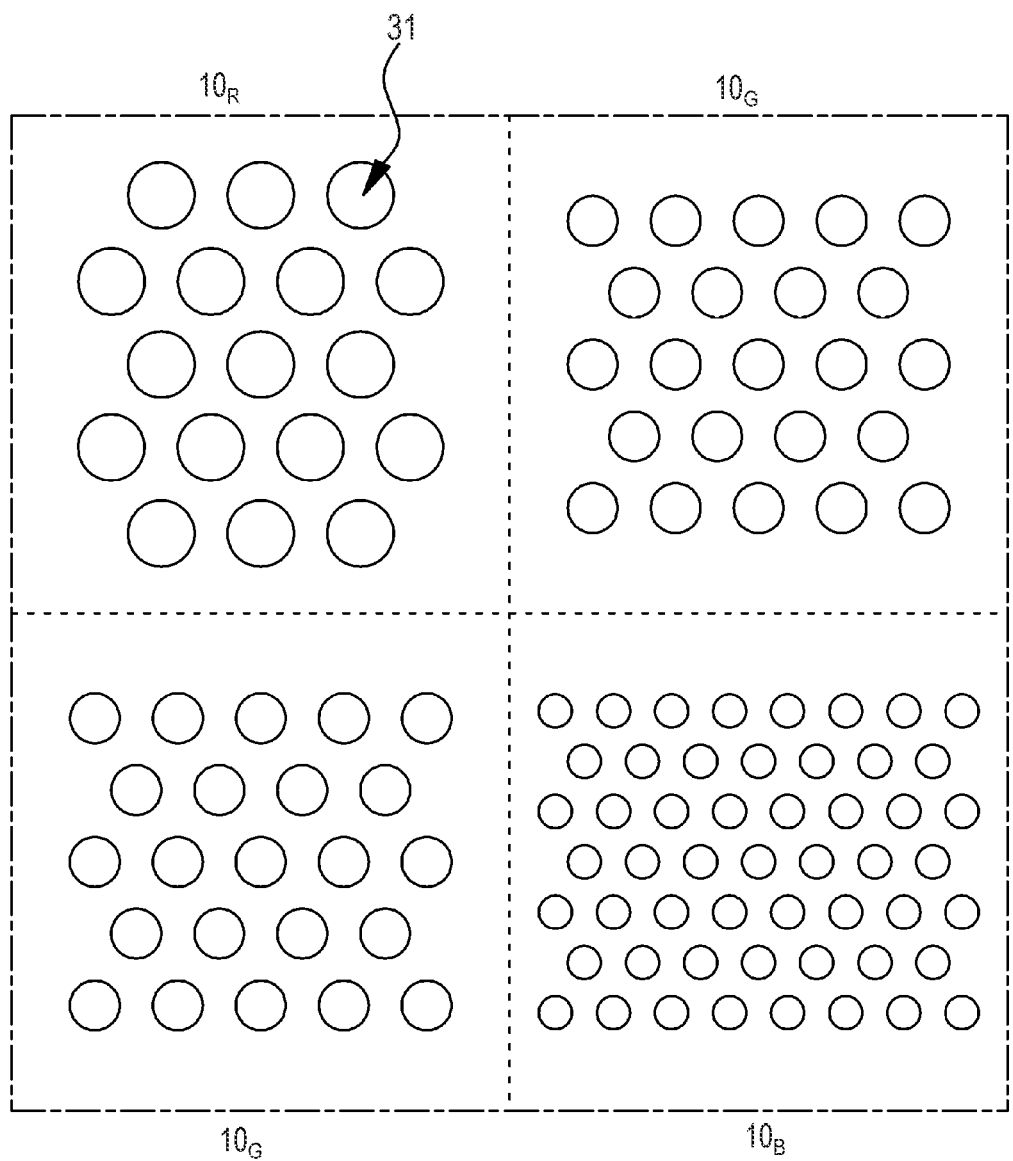
FIG. 15 is a diagram schematically showing arrangement of pixel regions and subpixel regions in a modification the two-dimensional solid-state imaging device of Example 5.

Although in Example 5, the two-dimensional solid-state imaging device has sensitivity to a single color, the configuration and structure of the metal layer and the opening in Example 5 may be applied to the Bayer arrangement, and the configuration and structure of the metal layer and the opening may be configured such that, as schematically shown in FIG. 15 regarding the arrangement of the pixel regions and the subpixel regions, red can be detected in one subpixel region $10_R$ from the four subpixel regions, blue can be detected in one subpixel region $10_B$, and green can be detected in the remaining two subpixel regions $10_G$. In this case, one photoelectric conversion element (light receiving element) may be provided in each of the subpixel regions $10_R$, $10_B$, and $10_G$. When the refractive index of the medium filling the opening is $n_0$, the distance between the openings may be, for example, $700/n_0$ (nm) in the subpixel region $10_R$ where red is detected, the distance between the openings may be, for example, $550/n_0$ (nm) in the subpixel region $10_G$ in which green is detected, and the distance between the openings may be, for example, $400/n_0$ (nm) in the subpixel region $10_B$ where blue is detected. The medium filling the opening 31 may vary in the respective subpixel regions $10_R$, $10_B$, and $10_G$. Instead of the Bayer arrangement, subpixel regions in which three or more wavelength components are detected may be arranged arbitrarily.

Figure 16A:
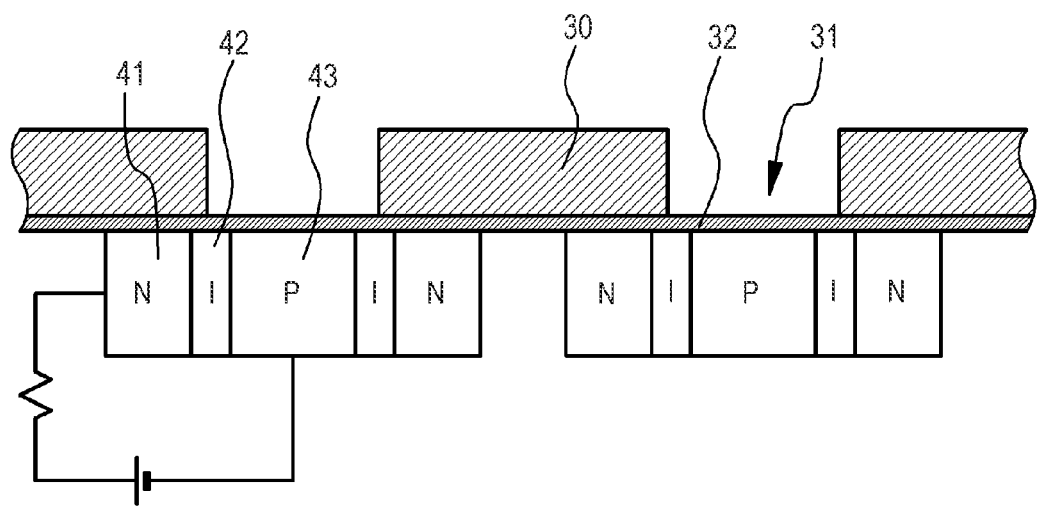
FIG. 16A is a schematic partial sectional view as a conceptual view of a two-dimensional solid-state imaging device using a PIN diode as a photoelectric conversion element.
Figure 16B:
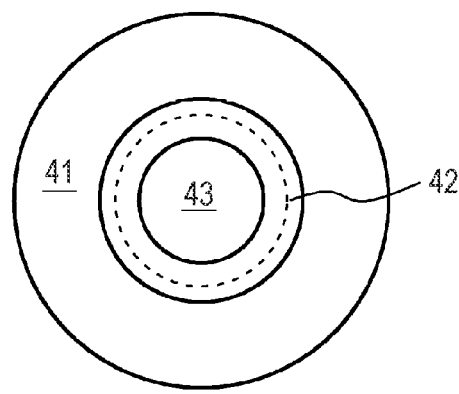
FIGS. 16B and 16C are partial arrangement diagrams (schematic views when an opening is viewed from above).
Figure 16C:
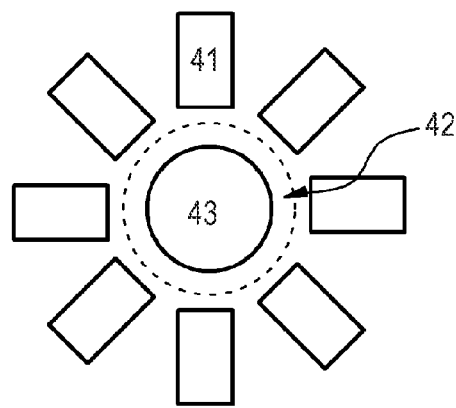

FIG. 16A is a schematic partial sectional view as a conceptual view, and FIGS. 16B and 16C show partial arrangement diagrams (schematic views when the opening is viewed from the above), in the two-dimensional solid-state imaging device described in each of Example 1 to 7, a PIN diode may be used as a photoelectric conversion element. An insulating part 42 of the PIN diode is arranged at a position including the projection image of the edge of the opening 31 provided in the metal layer 30. A reverse bias voltage is applied to the PIN. Near-field light generated at the opening edge of the metal layer 30 is absorbed by the insulating part 42, and electron-hole pairs are generated. The generated electron-hole pairs are drifted in opposite directions and detected at both ends of load resistance as a signal voltage. Similarly to Example 1, when one PIN diode is arranged in the opening 31, as shown in FIG. 16B, an n-type semiconductor region 41 and a p-type semiconductor region 43 may be arranged in a ring shape and a circular shape. Similarly to Example 7, when a plurality of PIN diodes are arranged in the opening 31, as shown in FIG. 16C, an n-type semiconductor region 41 and a p-type semiconductor region 43 may be arranged such that a plurality of n-type semiconductor regions 41 surround a circular p-type semiconductor region 43. In the drawings, a dotted line represents a projection image of the edge of the opening 31.

Figure 17A:
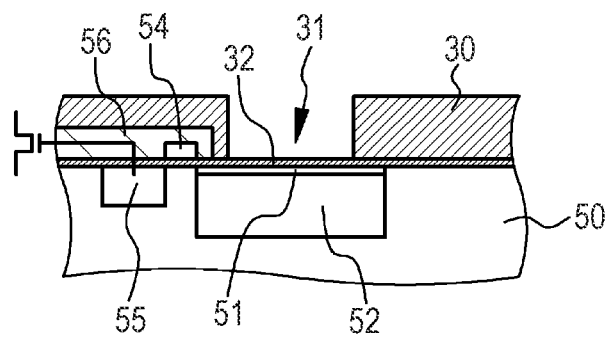
FIGS. 17A to 17D are schematic partial sectional views as a conceptual view of a two-dimensional solid-state imaging device using a buried photodiode as a photoelectric conversion element.
Figure 17B:
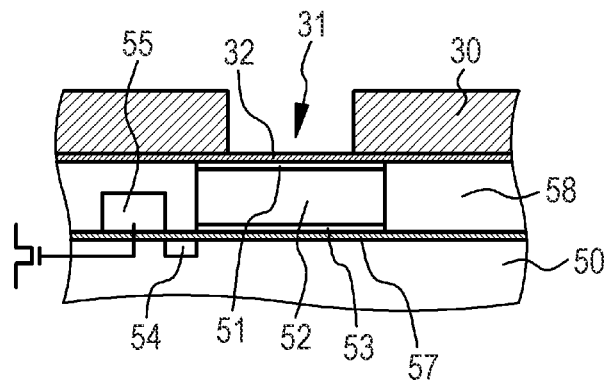
Figure 17C:
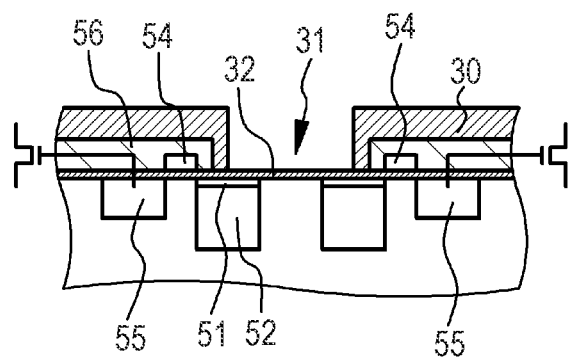
Figure 17D:
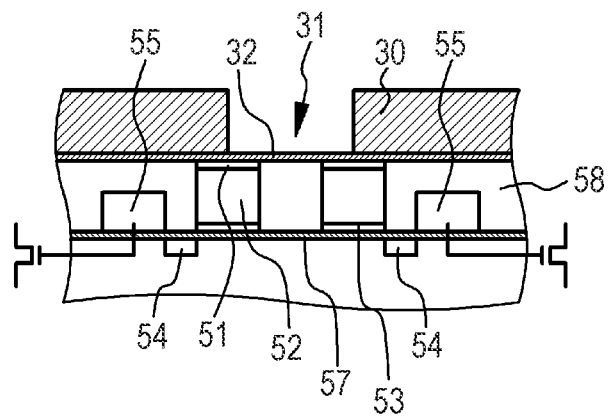

FIGS. 17A to 17D are schematic partial sectional views as a conceptual view. As shown in FIGS. 17A to 17D, in the two-dimensional solid-state imaging device described in each of Examples 1 to 7, a buried photodiode may be used as a photoelectric conversion element. FIG. 17A shows a front surface irradiation-type two-dimensional solid-state imaging device, and FIG. 17B shows a rear surface irradiation-type two-dimensional solid-state imaging device. In FIGS. 17A and 17B, similarly to Example 1, one buried photodiode is arranged in an opening. Reference numeral 50 denotes a P-type well, reference numerals 51, 52, and 53 denote a p-type semiconductor layer, an n-type semiconductor layer, and a p-type semiconductor layer constituting a buried photodiode. Reference numeral 56 denotes an insulating interlayer, reference numeral 57 denotes an insulating layer, and reference numeral 58 denotes a semiconductor layer. Near-field light generates electron-hole pairs in the buried photodiode and the electrons are accumulated. The accumulated electrons are read as a potential by an FD region (floating diffusion region) 55 through a gate 54. FIG. 17C shows a front surface irradiation-type two-dimensional solid-state imaging device, and FIG. 17D shows a rear surface irradiation-type two-dimensional solid-state imaging device. In FIGS. 17C and 17D, similarly to Example 7, a plurality of buried photodiodes are arranged in an opening.

Figure 18A:
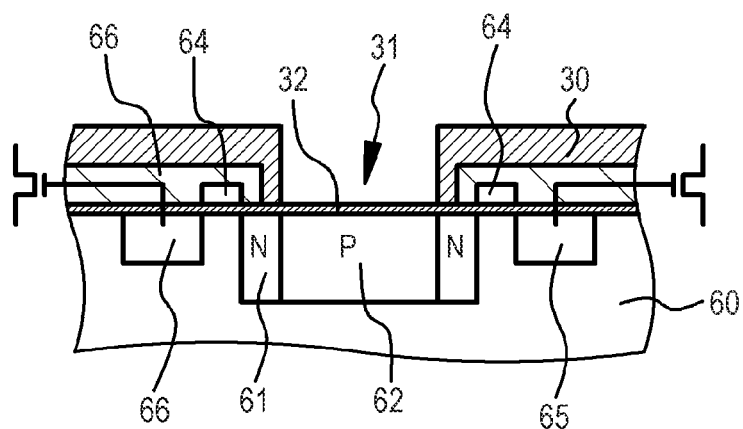
FIG. 18A is a schematic partial sectional view as a conceptual view of a two-dimensional solid-state imaging device using a photodiode with a horizontal PN junction as a photoelectric conversion element.

FIG. 18A is a schematic partial sectional view as a conceptual view. As shown in FIG. 18A, in the two-dimensional solid-state imaging device described in each of Examples 1 to 7, a photodiode with a horizontal PN junction may be used as a photoelectric conversion element. Reference numeral 60 denotes a P-type well, reference numerals 61 and 62 denote an n-type semiconductor region and a p-type semiconductor region constituting a photodiode, and reference numeral 66 denotes an insulating interlayer. Near-field light generated at the edge of the opening 31 of the metal layer 30 generates electron-hole pairs in the photodiode, and the electrons are accumulated in the n-type semiconductor region 61. The accumulated electrons are read as a potential by an FD region 65 through a gate 64.

Figure 18B:
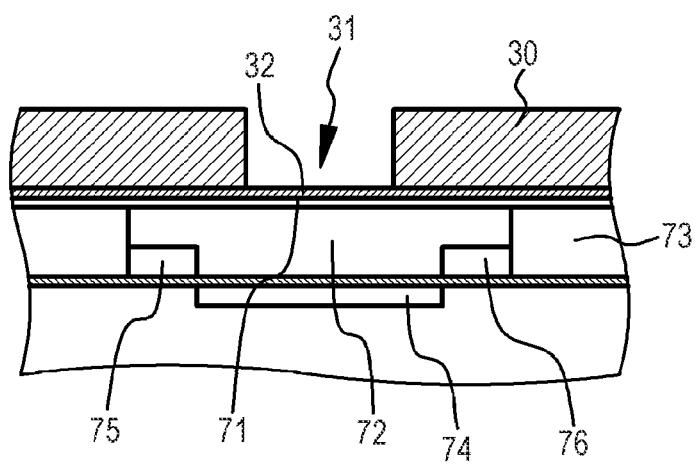
FIGS. 18B and 18C are schematic partial section view as a conceptual view of a two-dimensional solid-state imaging device using a threshold modulation image sensor (CMD) as a photoelectric conversion element.
Figure 18C:
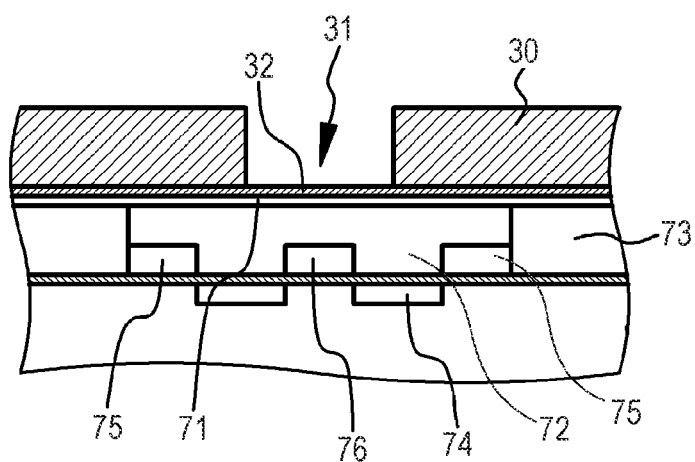

FIGS. 18B and 18C are schematic partial sectional views as a conceptual view. As shown in the drawings, in the two-dimensional solid-state imaging device described in each of Examples 1 to 7, a threshold modulation-type image sensor (CMD) may be used as a photoelectric conversion element. FIG. 18B shows a case one threshold modification-type image sensor is arranged in an opening, similarly to Example 1. Reference numerals 71 and 72 respectively denote an n-type semiconductor layer and a p-type semiconductor layer constituting the threshold modification-type image sensor, and reference numerals 73, 74, 75, and 76 respectively denote an n-type semiconductor layer, a gate, a drain region which is an n+ semiconductor region, and a source region which is an n+ semiconductor region. Near-field light generates electron-hole pairs in the threshold modification-type image sensor. The generated electron or hole modulates the threshold voltage of the pixel transistor, so the change amount can be read as an accumulated signal amount. FIG. 18C shows an example where a plurality of threshold modification-type image sensor are arranged in an opening, similarly to Example 7.

It should be understood by those skilled in the art that various modifications, combinations, sub-combinations and alterations may occur depending on design requirements and other factors insofar as they are within the scope of the appended claims or the equivalents thereof.

What is claimed is:

1. A camera system, comprising:
    a two-dimensional solid-state imaging device with pixel regions arranged in a two-dimensional matrix; and
    a lens system to direct light onto the solid-state imaging device,
    wherein,
        each pixel region has a plurality of subpixel regions,
        metal layer with an opening of an opening size smaller than the wavelength of an incoming electromagnetic wave and a photoelectric conversion element are arranged with an insulating film interposed therebetween,
        at least one photoelectric conversion element is arranged in the opening provided at a portion of the metal layer in each subpixel region,
        a projection image of the opening is included in a light receiving region of the photoelectric conversion element,
        the opening is arrayed so as to cause a resonance state based on surface plasmon polariton excited by the incoming electromagnetic wave, and
        near-field light generated near the opening in the resonance state is converted to an electrical signal by the photoelectric conversion element.

2. The camera system of claim 1, wherein the thickness of the insulating film is equal to or smaller than $1 \times 10^{-7}$ m.

3. The camera system of claim 1, wherein:
    each pixel region includes a first subpixel region and M subpixel regions adjacent to the first subpixel region,
    each subpixel region has one opening, and
    when the distance from the center of the opening of the first subpixel region to the center of the opening of the m-th subpixel region [where m is 2, 3, . . . , and (M+1)] is $L_m$, near-field light corresponding to a wavelength component depending on a wavelength component of the incoming electromagnetic wave and the distance $L_m$ is converted to an electrical signal by the photoelectric conversion element.

4. The camera system of claim 3, wherein near-field light corresponding to wavelength components depending on q (where q is a natural number equal to or greater than 2 and equal to or smaller than M) wavelength components of the incoming electromagnetic wave and q' (where q' is a natural number equal to or greater 2 and equal to or smaller than M) distances $L_m$ is converted to an electrical signal by the photoelectric conversion element in at least the m-th subpixel region.

5. The camera system of claim 3, wherein:
the value of M is 3, and
the center of the opening of each of four subpixel regions in one pixel region is located at the apex of a virtual square, a virtual rectangle, or a virtual parallelogram.

6. The camera system of claim 1, wherein:
each pixel region includes a first subpixel region and N subpixel regions surrounding the first subpixel region,
each subpixel region has one opening, and
when the distance from the center of the opening of the first subpixel region to the center of the opening of the n-th subpixel region [where n is 2, 3, ..., and (N+1)] is $L_n$, near-field light corresponding to a wavelength component depending on a wavelength component of the incoming electromagnetic wave and the distance $L_n$ is converted into an electrical signal by the photoelectric conversion element.

7. The camera system of claim 6, wherein near-field light corresponding to wavelength components depending on q (where q is a natural number equal to or greater than 1 and equal to or smaller than N) wavelength components of the incoming electromagnetic wave and q' (where q' is a natural number equal to or greater than 1 and equal to or smaller than N) distances $L_n$ is converted to an electrical signal by the photoelectric conversion element in at least the n-th subpixel region.

8. The camera system of claim 6, wherein:
the value of N is 6, and
the center of the opening of each of N subpixel regions surrounding the first subpixel region in one pixel region is located at the apex of a virtual regular hexagon, and the center of the opening of the first subpixel region is located at the center of the virtual regular hexagon.

9. The camera system of claim 6, wherein:
the value of N is 8, and
the center of the opening of each of four adjacent subpixel regions in one pixel region is located at the apex of a virtual square, a virtual rectangle, or a virtual parallelogram.

10. The camera system of claim 1, wherein:
a plurality of photoelectric conversion elements are arranged with respect to one opening provided at a portion of the metal layer,
a projection image of an edge of the opening is included in the light receiving regions of a plurality of photoelectric conversion elements while a projection image of the opening is not included in the light receiving region of the photoelectric conversion element, and
near-field light generated near the opening in the resonance state based on the wavelength of the incoming electromagnetic wave and the distribution pattern of periodic openings is converted to an electrical signal by a plurality of photoelectric conversion elements, thereby acquiring information regarding polarization of the incoming electromagnetic wave.

11. The camera system of claim 10, wherein:
$2P_0$ photoelectric conversion elements are arranged in a circular pattern with respect to one opening, and
the p-th photoelectric conversion element (where p is 1, 2, ..., and $P_0$) and the $(p+P_0)$th photoelectric conversion element are paired to acquire information regarding polarization of the incoming electromagnetic wave.

12. The camera system of claim 11, wherein the value of $P_0$ is one of 2, 3, and 4.

13. The camera system of claim 1, a refractive index variable layer is provided on the light incoming side of the opening.

14. The camera system of claim 1, wherein the photoelectric conversion element includes a CMOS, CCD, PIN diode, or CMD signal amplification-type image sensor.

15. The camera system of claim 1, wherein the incoming electromagnetic wave is visible light with a wavelength in a range of 0.4 μm to 0.7 μm.

16. The camera system of claim 1, wherein the incoming electromagnetic wave is an ultraviolet ray with a wavelength equal to or smaller than 0.4 μm or an infrared way with a wavelength equal to or greater than 0.7 μm.

* * * * *